US011195997B2

(12) United States Patent
Paik et al.

(10) Patent No.: US 11,195,997 B2
(45) Date of Patent: Dec. 7, 2021

(54) VARIABLE RESISTANCE MEMORY DEVICES INCLUDING SELF-HEATING LAYER AND METHODS OF MANUFACTURING THE SAME

(71) Applicant: SAMSUNG ELECTRONICS CO., LTD., Suwon-si (KR)

(72) Inventors: Junhwan Paik, Hwaseong-si (KR); Yongjin Park, Seoul (KR); Jinwook Yang, Hwaseong-si (KR); Gyuhwan Oh, Hwaseong-si (KR); Jiyoon Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/826,778

(22) Filed: Mar. 23, 2020

(65) Prior Publication Data
US 2021/0028357 A1    Jan. 28, 2021

(30) Foreign Application Priority Data

Jul. 23, 2019   (KR) .................. 10-2019-0088777

(51) Int. Cl.
*H01L 47/00*    (2006.01)
*H01L 45/00*    (2006.01)
*H01L 23/528*   (2006.01)
*H01L 27/24*    (2006.01)

(52) U.S. Cl.
CPC ............ *H01L 45/06* (2013.01); *H01L 23/528* (2013.01); *H01L 27/2427* (2013.01); *H01L 27/2463* (2013.01); *H01L 45/126* (2013.01); *H01L 45/1233* (2013.01); *H01L 45/1683* (2013.01)

(58) Field of Classification Search
CPC ... H01L 45/06; H01L 23/528; H01L 27/2463; H01L 45/1683; H01L 45/1233; H01L 45/126; H01L 27/2427
See application file for complete search history.

(56) References Cited

U.S. PATENT DOCUMENTS

| 6,372,572 | B1* | 4/2002  | Yu ..................... H01L 27/10852 |
|           |     |         |                       257/E21.019 |
| 6,426,891 | B1* | 7/2002  | Katori .................... G11C 7/04 |
|           |     |         |                       257/E27.004 |
| 8,049,197 | B2  | 11/2011 | Kau |
| 8,535,952 | B2* | 9/2013  | Ranjan ................... G11C 11/16 |
|           |     |         |                                438/3 |
| 8,574,954 | B2  | 11/2013 | Tang |
| 8,575,032 | B2  | 11/2013 | Light et al. |
| 8,772,096 | B2  | 7/2014  | Ko et al. |

(Continued)

FOREIGN PATENT DOCUMENTS

| KR | 10-869843       | 11/2008 |
| KR | 10-2011-0035784 A | 4/2011 |
| KR | 10-1064219 B1   | 9/2011 |

*Primary Examiner* — Caleb E Henry
(74) *Attorney, Agent, or Firm* — Lee IP Law, P.C.

(57) ABSTRACT

A variable resistance memory device includes a first conductive line structure having an adiabatic line therein on a substrate, a variable resistance pattern contacting an upper surface of the first conductive line structure, a low resistance pattern contacting an upper surface of the variable resistance pattern, a selection structure on the low resistance pattern, and a second conductive line on the selection structure.

20 Claims, 23 Drawing Sheets

(56) References Cited

U.S. PATENT DOCUMENTS

| | | | |
|---|---|---|---|
| 8,790,976 B2 | 7/2014 | Oh et al. | |
| 9,318,700 B2 | 4/2016 | Wu et al. | |
| 9,419,221 B2 | 8/2016 | Kang | |
| 2004/0251551 A1* | 12/2004 | Hideki | H01L 45/1233 257/758 |
| 2006/0039192 A1* | 2/2006 | Ha | H01L 27/2436 365/163 |
| 2006/0104110 A1* | 5/2006 | Sun | G11C 11/161 365/173 |
| 2006/0187703 A1* | 8/2006 | Mizuguchi | B82Y 25/00 365/158 |
| 2008/0180989 A1* | 7/2008 | Baek | G11C 13/02 365/158 |
| 2009/0140233 A1* | 6/2009 | Kinoshita | G11C 5/02 257/4 |
| 2010/0163832 A1* | 7/2010 | Kau | H01L 45/126 257/4 |
| 2011/0147695 A1* | 6/2011 | Lee | H01L 45/1675 257/4 |
| 2012/0224413 A1* | 9/2012 | Zhang | H01L 45/1233 365/148 |
| 2012/0225534 A1* | 9/2012 | Lee | H01L 45/06 438/382 |
| 2013/0126510 A1* | 5/2013 | Oh | H01L 45/1233 219/209 |
| 2013/0207068 A1* | 8/2013 | Pellizzer | H01L 27/2427 257/5 |
| 2015/0035041 A1* | 2/2015 | Shinohara | H01L 27/11575 257/324 |
| 2015/0137061 A1* | 5/2015 | Donghi | H01L 27/2445 257/4 |
| 2016/0240774 A1* | 8/2016 | Masuoka | H01L 27/2463 |

* cited by examiner

VARIABLE RESISTANCE MEMORY DEVICES INCLUDING SELF-HEATING LAYER AND METHODS OF MANUFACTURING THE SAME

CROSS-REFERENCE TO RELATED APPLICATION

Korean Patent Application No. 10-2019-0088777, filed on Jul. 23, 2019, in the Korean Intellectual Property Office, and entitled: "Variable Resistance Memory Devices and Methods of Manufacturing the Same," is incorporated by reference herein in its entirety.

BACKGROUND

1. Field

Embodiments relate to a variable resistance memory device and a method of manufacturing the same.

2. Description of the Related Art

In a method of manufacturing a PRAM device, a lower electrode, a variable resistance pattern, and/or an upper electrode may be formed by a damascene process, and the aspect ratio of a mold in which the lower electrode, the variable resistance pattern, and/or the upper electrode may be formed may be increased.

SUMMARY

The embodiments may be realized by providing a variable resistance memory device including a first conductive line structure on a substrate, the first conductive line structure having an adiabatic line therein; at least one variable resistance pattern contacting an upper surface of the first conductive line structure; a low resistance pattern contacting an upper surface of the at least one variable resistance pattern; a selection structure on the low resistance pattern; and a second conductive line on the selection structure.

The embodiments may be realized by providing a variable resistance memory device including a first conductive line structure on a substrate, the first conductive line structure extending in a first direction substantially parallel to an upper surface of the substrate; variable resistance patterns spaced apart from each other in the first direction, each of the variable resistance patterns contacting an upper surface of the first conductive line structure; a mold and a filling structure on the first conductive line structure, the mold and the filling structure being alternately arranged in respective spaces between neighboring ones of the variable resistance patterns in the first direction; an etch stop pattern on the mold; a low resistance pattern contacting an upper surface of a respective one of the variable resistance patterns; and a selection structure on the low resistance pattern.

The embodiments may be realized by providing a variable resistance memory device including first conductive line structures spaced apart from each other in a second direction on a substrate, each of the first conductive line structures extending in a first direction, each of the first and second directions being substantially parallel to an upper surface of the substrate, and the first direction crossing the second direction; second conductive lines spaced apart from each other in the first direction on the first conductive line structures, each of the second conductive lines extending in the second direction; variable resistance patterns between the first conductive line structures and the second conductive lines at respective areas where the first conductive line structures and the second conductive lines overlap each other in a third direction substantially perpendicular to the upper surface of the substrate, the variable resistance patterns contacting upper surfaces of the first conductive line structures, respectively; a filling structure including a first portion extending in the first direction between the first conductive line structures on the substrate, the first portion contacting each of opposite sidewalls in the second direction of the variable resistance patterns; and second portions extending in the second direction from the first portion on the first conductive line structures, each of the second portions contacting a sidewall in the first direction of a corresponding one of the variable resistance patterns; molds on each of the first conductive line structures, each of the molds contacting a sidewall in the first direction of the corresponding one of the variable resistance patterns, and the sidewall not being contacted by each of the second portions; a low resistance pattern contacting an upper surface of each of the variable resistance patterns; and a selection structure on the low resistance pattern, wherein each of the first conductive line structures includes an adiabatic line between first conductive lines in the third direction, and wherein the selection structure includes a first buffer, a selection pattern, and a second buffer sequentially stacked in the third direction.

The embodiments may be realized by providing a method of manufacturing a variable resistance memory device, the method including forming a first conductive layer structure on a substrate; forming spacer lines, mold lines, and first filling lines on the first conductive layer structure, the spacer lines being spaced apart from each other in a first direction substantially parallel to an upper surface of the substrate, and the mold lines and the first filling lines being alternately arranged in respective spaces between the spacer lines in the first direction; patterning the spacer lines, the first filling lines, the mold lines, and the first conductive layer structure to form spacer patterns, first filling patterns, molds, and first conductive line structures, respectively, the first conductive line structures being spaced apart from each other in a second direction substantially parallel to the upper surface of the substrate and crossing the first direction, each of the first conductive line structures extending in the first direction, and each of the first conductive line structures and the spacer patterns, the first filling patterns and the molds on each of the first conductive line structures forming a first stacked structure; forming a second filling line between neighboring ones of the first stacked structures in the second direction on the substrate; replacing the spacer patterns with variable resistance patterns, respectively; and forming a low resistance pattern and a selection structure sequentially stacked on each of the variable resistance patterns.

The embodiments may be realized by providing a method of manufacturing a variable resistance memory device, the method including forming conductive line structures on a substrate, each of the conductive line structures extending in a first direction substantially parallel to an upper surface of the substrate, and the conductive line structures being spaced apart from each other by a first insulating interlayer in a second direction substantially parallel to the upper surface of the substrate and crossing the first direction, forming spacer lines, mold lines, and first filling lines on the conductive line structures and the first insulating interlayer, the spacer lines being spaced apart from each other in the first direction, the mold lines, and the first filling lines being alternately arranged in respective spaces between the spacer lines in the first direction, and each of the mold lines having an etch stop line thereon; patterning the spacer lines, the first filling lines, the mold lines, and the etch stop lines to form stacked structures spaced apart from each other in the second direction by first openings each exposing an upper surface of the first insulating interlayer and extending in the first direction, forming spacer patterns, first filling patterns, molds, and etch stop patterns, respectively, from the spacer lines, the first filling lines, the mold lines, and the etch stop lines, on each of the conductive layer structures; forming a second filling layer on the exposed upper surface of the first insulating interlayer and the stacked structures to fill the first openings; planarizing the second filling layer until the etch stop patterns are exposed to form second filling lines in the first openings, respectively; replacing the spacer patterns with variable resistance patterns, respectively; and forming a low resistance pattern and a selection structure sequentially stacked on each of the variable resistance patterns.

The embodiments may be realized by providing a method of manufacturing a variable resistance memory device, the method including forming a conductive layer structure on a substrate; forming mold lines on the conductive layer structure, the mold lines being spaced apart from each other in a first direction substantially parallel to an upper surface of the substrate by first openings each exposing an upper surface of the conductive layer structure, and each of the mold lines extending in a second direction substantially parallel to the upper surface of the substrate and crossing the first direction; forming a spacer layer on the exposed upper surface of the conductive layer structure, sidewalls of the first openings, and upper surfaces of the mold lines; performing an etch back process on the spacer layer to remove portions of the spacer layer on the conductive layer structure and the mold lines so that an upper portion of each of the first openings is enlarged, forming spacer lines on opposite sidewalls, respectively, of the mold lines, from the spacer layer; forming first filling lines to fill the first openings, respectively; patterning the spacer lines, the first filling lines, the mold lines, and the conductive layer structure to form spaced apart from each other patterns, first filling patterns, molds, and conductive line structures, respectively, each of the conductive line structures extending in the first direction, the conductive line structures being spaced apart from each other in the second direction, and each of the conductive line structures, and the spacer patterns, the first filling patterns and the molds on each of the conductive line structures forming a stacked structure; forming a second filling line between the stacked structures on the substrate; replacing the spacer patterns with variable resistance patterns, respectively; and forming a low resistance pattern and a selection structure sequentially stacked on each of the variable resistance patterns.

BRIEF DESCRIPTION OF THE DRAWINGS

Features will become apparent to those of skill in the art by describing in detail exemplary embodiments with reference to the attached drawings in which.

DETAILED DESCRIPTION

FIGS. 1 to 15 illustrate perspective views of stages in a method of manufacturing a variable resistance memory device in accordance with example embodiments.

Hereinafter in the specifications (not in the claims), two directions intersecting with each other among horizontal directions substantially parallel to an upper surface of a substrate are defined as first and second directions, respectively, and a vertical direction substantially perpendicular to the upper surface of the substrate is defined as a third direction. In example embodiments, the first and second directions may be orthogonal to each other.

Figure 1:
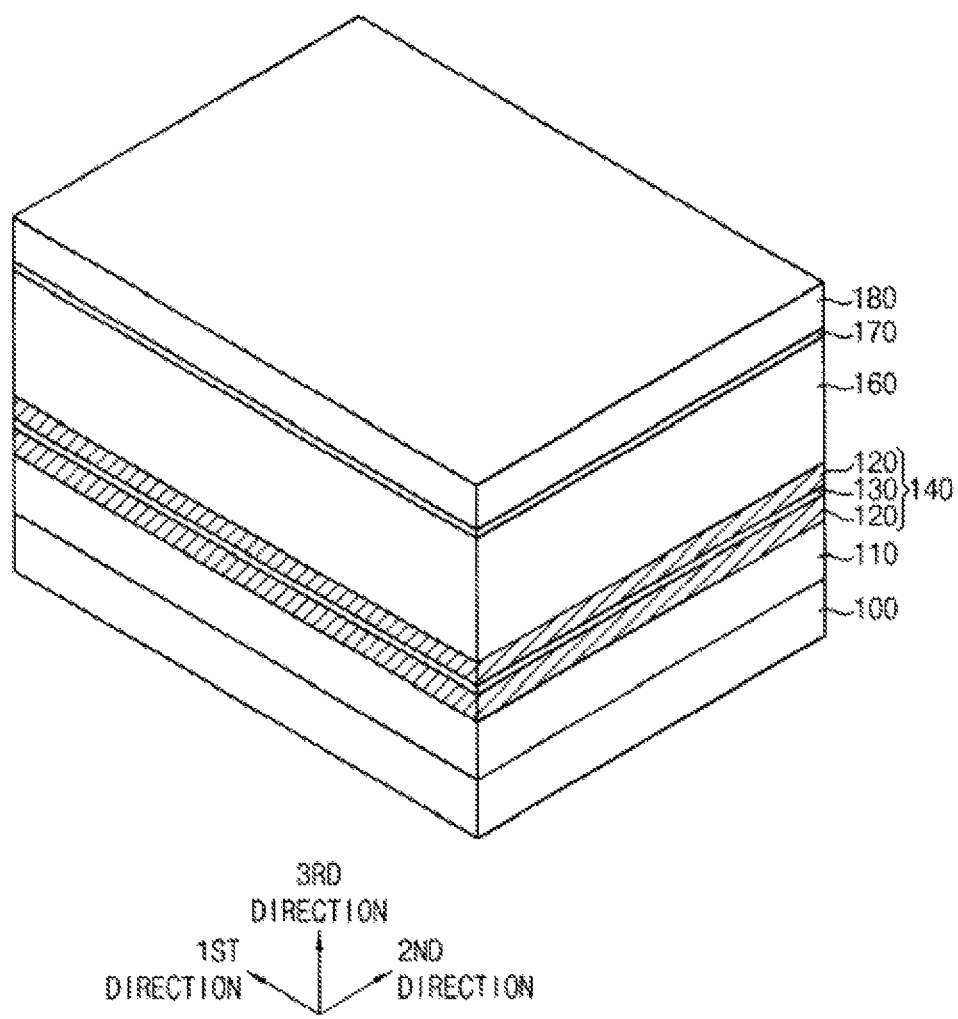
FIGS. 1 to 15 illustrate perspective views of stages in a method of manufacturing a variable resistance memory device in accordance with example embodiments.

Referring to FIG. 1, a first insulating interlayer 110, a first conductive layer structure 140, a mold layer 160, an etch stop layer 170, and a first mask layer 180 may be sequentially stacked on a substrate 100.

The substrate 100 may include semiconductor materials, e.g., silicon, germanium, silicon-germanium, etc., or III-V compounds e.g., GaP, GaAs, GaSb, etc. In an implementation, the substrate 100 may be a silicon-on-insulator (SOI) substrate or a germanium-on-insulator (GOI) substrate.

In an implementation, various other elements, e.g., a gate structure, a source/drain layer, a contact plug, a via, a wiring, etc., may be formed on the substrate 100, and may be covered by the first insulating interlayer 110. The first insulating interlayer 110 may include an oxide, e.g., a silicon oxide.

The first conductive layer structure 140 may include a first conductive layer 120, an adiabatic layer 130, and another of the first conductive layer 120 sequentially stacked. For example, the first conductive layer structure 140 may have a structure in which the adiabatic layer 130 is inserted or sandwiched between two of the first conductive layers 120, and may have a low heat conductivity.

The first conductive layer 120 may include a metal, e.g., tungsten (W), platinum (Pt), copper (Cu), aluminum (Al), titanium (Ti), tantalum (Ta), or the like. In an implementation, a first barrier layer including a metal nitride or a metal silicon nitride, e.g., titanium nitride ($TiN_x$), titanium silicon nitride ($TiSiN_x$), tungsten nitride ($WN_x$), tungsten silicon nitride ($WSiN_x$), tantalum nitride ($TaN_x$), tantalum silicon nitride ($TaSiN_x$), or the like, may be further formed between the first insulating interlayer 110 and the first conductive layer 120.

The adiabatic layer 130 may include a material having a heat conductivity less than that of the first conductive layer 120, and heat transferred from the first conductive layer 120 may be prevented from being discharged out of the first conductive layer structure 140. In an implementation, the adiabatic layer 130 may include, e.g., carbon (e.g., pure carbon), a carbon compound, or a metal containing carbon. In an implementation, the adiabatic layer 130 may include, e.g., carbon, carbonitride, titanium carbonitride, tantalum carbonitride. As used herein, the term "or" is not an exclusive term, e.g., "A or B" would include A, B, or A and B.

The mold layer 160 may include a nitride, e.g., silicon nitride, the etch stop layer 170 may include, e.g., carbon, carbon compounds, polysilicon, or the like, and the first mask layer 180 may include an oxide, e.g., silicon oxide.

Figure 2:
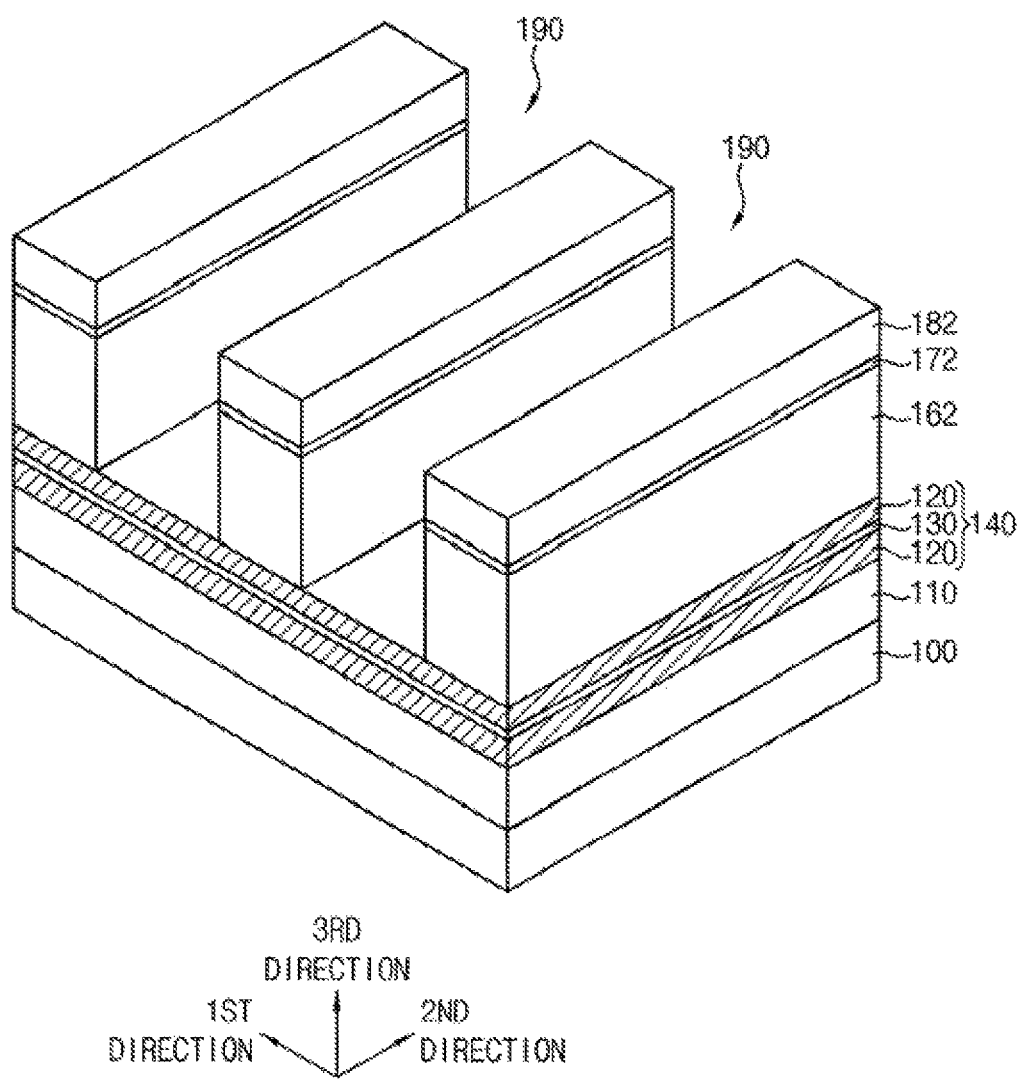

Referring to FIG. 2, the first mask layer 180 may be patterned by a photolithography process using a double patterning process or an EUV to form a plurality of first masks 182, each of which may extend (e.g., lengthwise) in the second direction, spaced apart from each other in the first direction, and the etch stop layer 170 and the mold layer 160 may be patterned using the first masks 182 as an etching mask to form etch stop lines 172 and mold lines 162, respectively, each of which may extend in the second direction.

The mold line 162, the etch stop line 172, and the first mask 182 sequentially stacked on the first conductive layer structure 140 may be referred to as a first stacked structure. In an implementation, the first stacked structure may extend (e.g., lengthwise) in the second direction, and a plurality of first stacked structures may be spaced apart from each other in the first direction. A first opening 190 may be between neighboring ones of the first stacked structures in the first direction to expose an upper surface of the first conductive layer structure 140.

Figure 3:
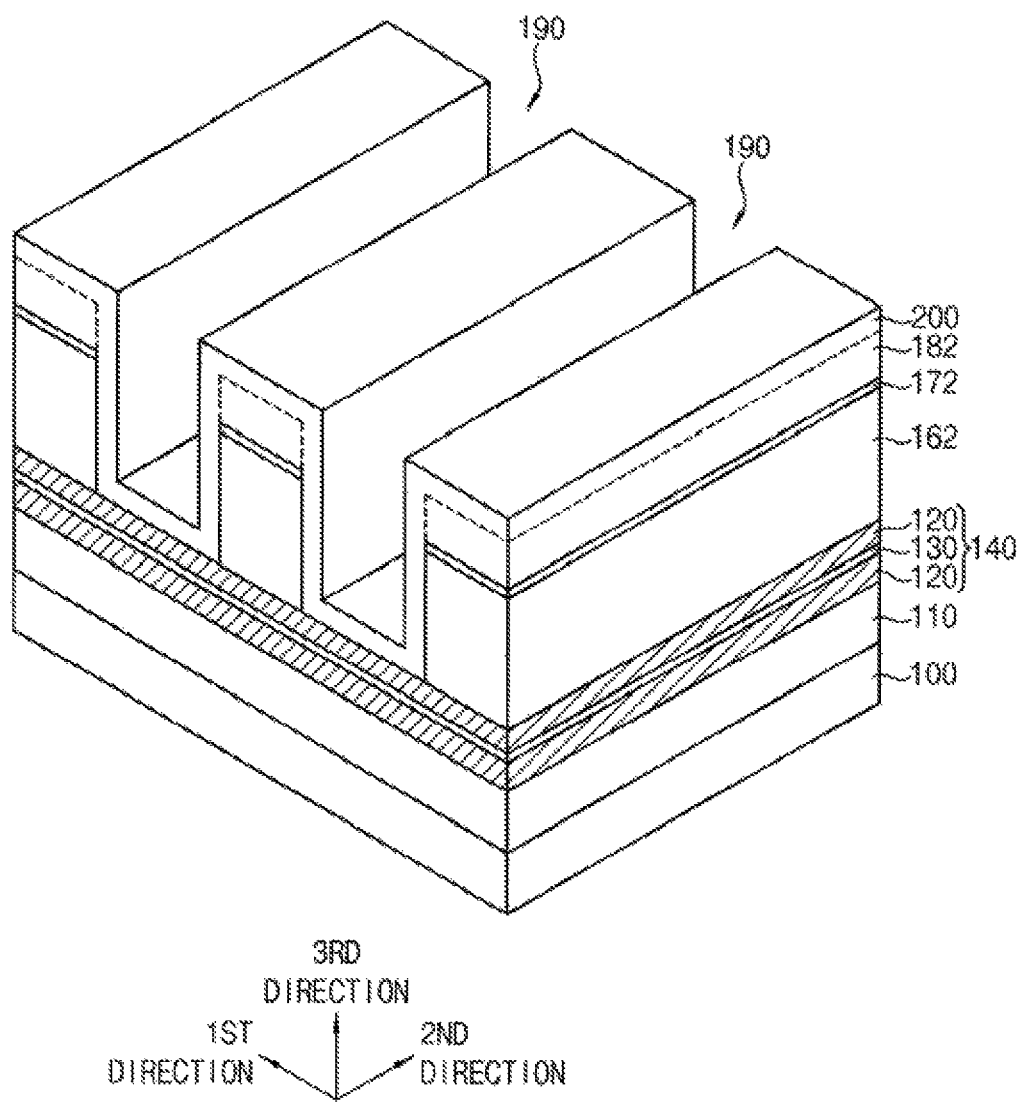

Referring to FIG. 3, a spacer layer 200 may be formed on a sidewall of the first opening 190, an upper surface of the first conductive layer structure 140 exposed by the first opening 190, and an upper surface of the first mask 182.

In an implementation, the spacer layer 200 may be formed by an atomic layer deposition (ALD) process. The spacer layer 200 may include an oxide, e.g., silicon oxide, and may include substantially the same material as the first mask 182 so as to be merged therewith.

Figure 4:
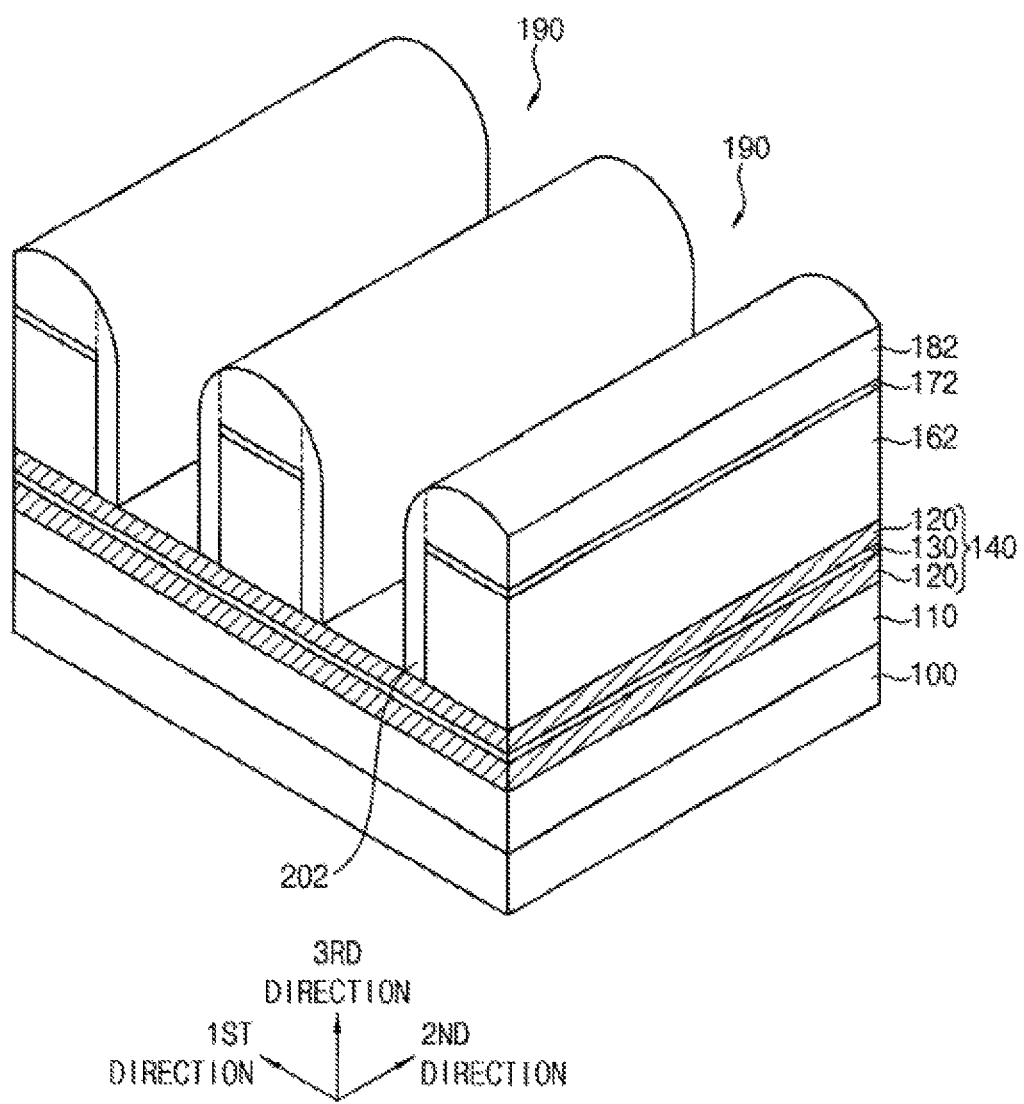

Referring to FIG. 4, the spacer layer 200 may be partially removed by, e.g., an etch back process.

Portions of the spacer layer 200 on the upper surface of the first mask 182 and the exposed upper surface of the first conductive layer structure 140 may be removed by the etch back process, and a portion of the first mask 182, e.g., an upper sidewall of the first mask 182 may be also removed. By the etch back process, the spacer layer 200 may become a spacer line 202 extending in the second direction on each of opposite sidewalls of the first stacked structure is the first direction, e.g., the etch back process may convert the spacer layer 200 into the spacer line 202.

In an implementation, an entrance of the first opening 190, e.g., an upper portion (e.g., open end) of the first opening 190 may be enlarged by an etch back process.

Figure 5:
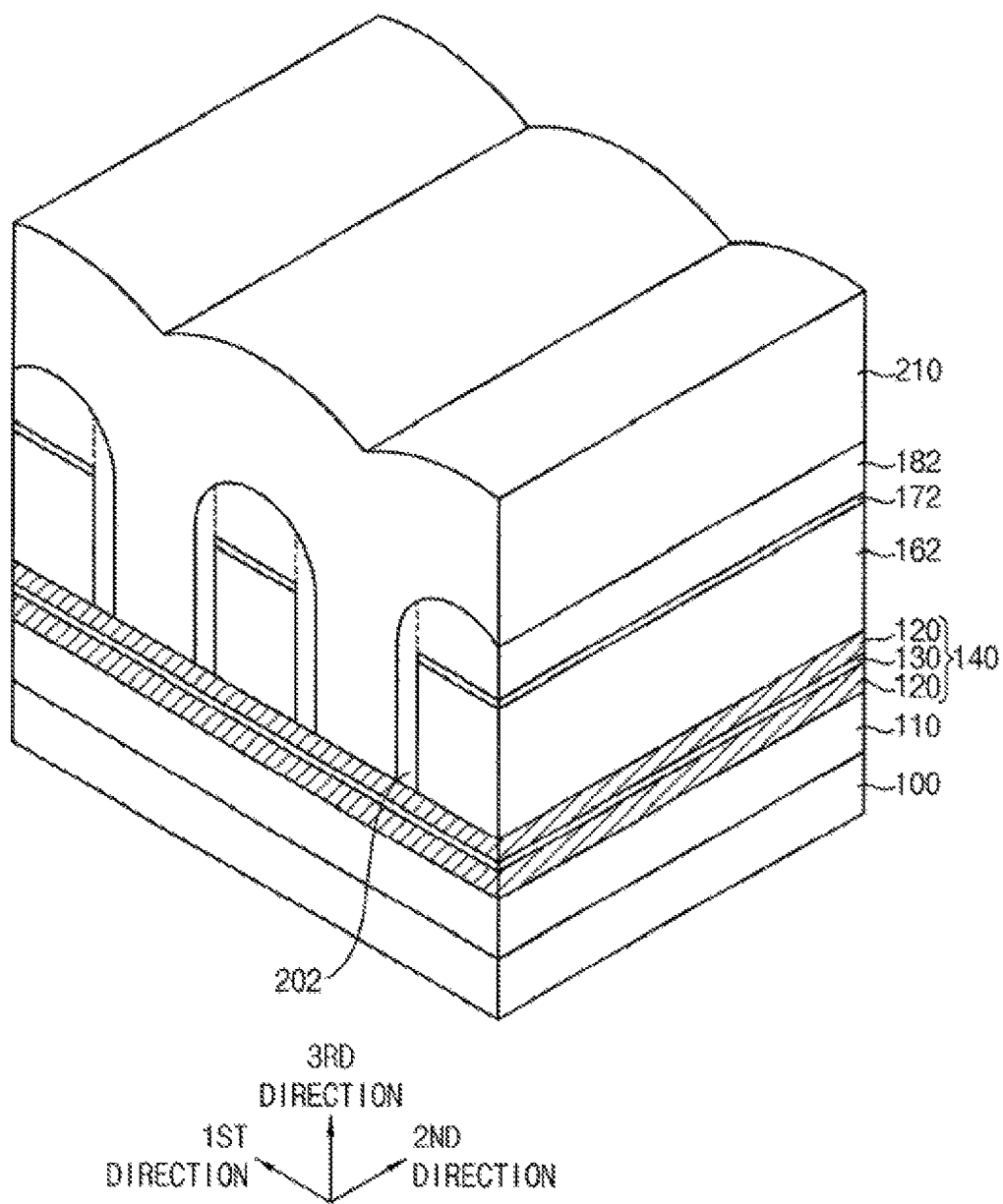

Referring to FIG. 5, a first filling layer 210 may be formed on the first conductive layer structure 140, the spacer line 202, and the first slacked structure to fill the first opening 190.

As described above, the upper portion of the first opening 190 may be been enlarged, and the first filling layer 210 may entirely fill the first opening 190, e.g., no seam or void may be generated therein. In an implementation, even if seam or void were to be generated, it may only be formed at an upper portion of the first opening 190.

The first filling layer 210 may include an insulating material, e.g., silicon nitride, silicon oxycarbide, or the like.

Figure 6:
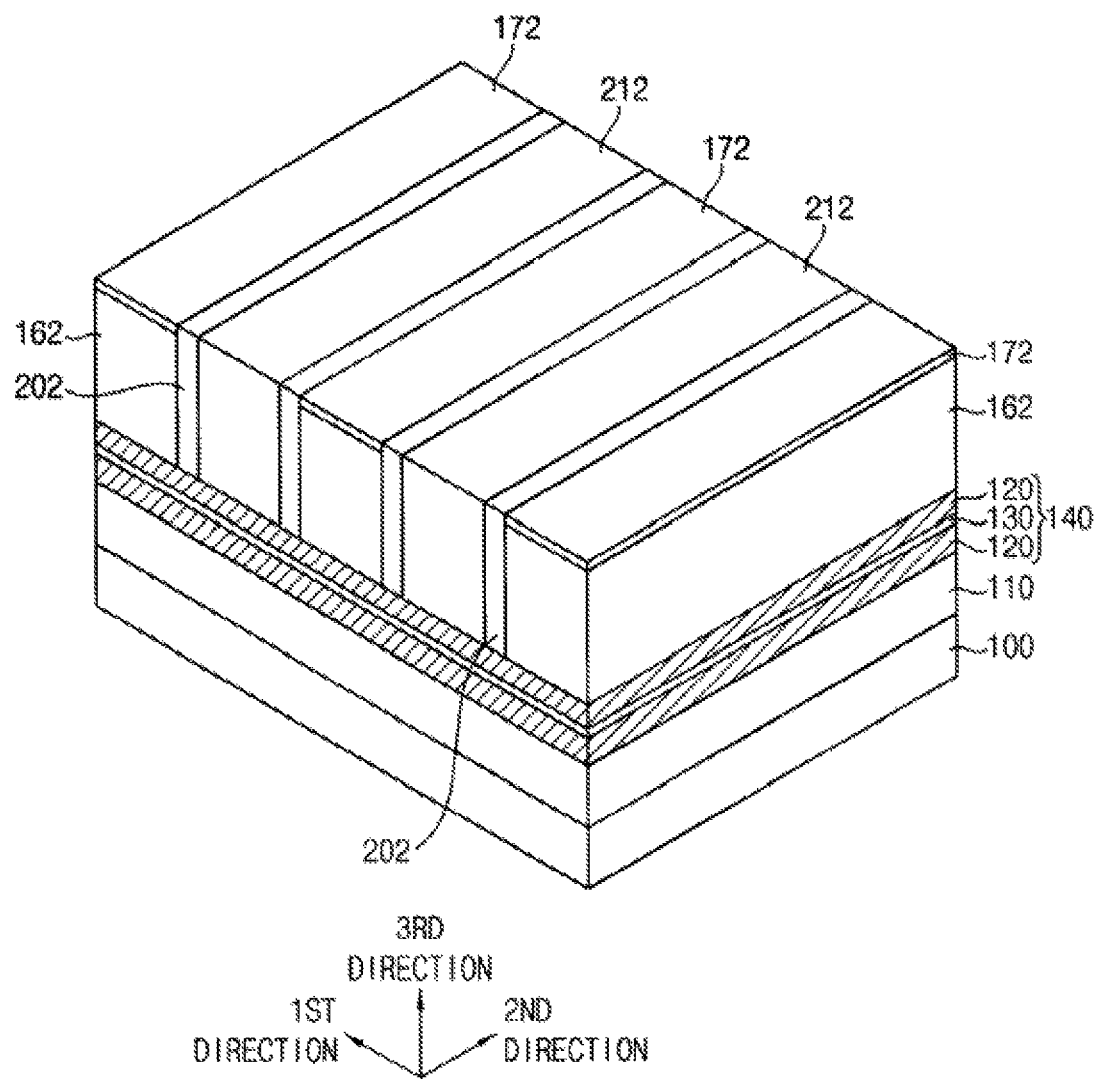

Referring to FIG. 6, an upper portion of the first filling layer 210 may be planarized to form a plurality of first filling lines 212, each of which may extend in the second direction, and may be spaced apart from each other in the first direction.

The planarization process may include a chemical mechanical polishing (CMP) process and/or an etch back process. The planarization process may be performed until an upper surface of the etch stop line 172 is exposed, and the first mask 182 of the first stacked structure may be also removed. The etch stop line 172 may be on the mold line 162, and the mold lines 162 may have a uniform height with no or little distribution depending on locations thereof.

By the planarization process, the mold lines 162 and the first filling lines 212 may be alternately arranged in the first direction on the first conductive layer structure 140, the spacer line 202 may be between die mold line 162 and the first filling line 212, and the etch stop line 172 may be on each of the mold lines 162.

If the seam or void is generated in the first filling layer 210, it may be removed during the planarization process because it is formed at the upper portion of the first opening 190 (e.g., farther from the substrate 100 than the etch stop line 172 is to the substrate 100).

Figure 7:
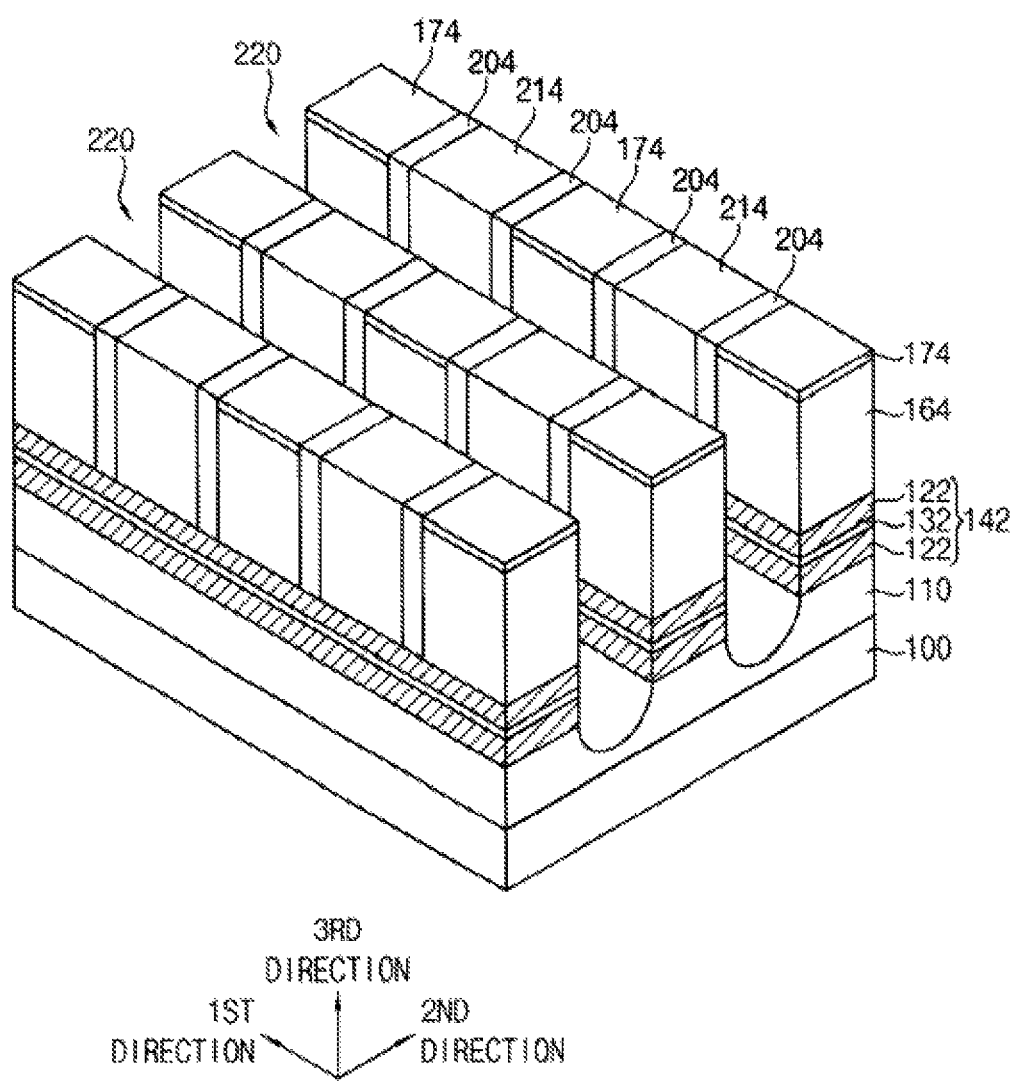

Referring to FIG. 7, a second mask layer may be formed on the etch stop lines 172, the first filling lines 212, and the spacer lines 202, and may be patterned by a photolithography process using, e.g., a double patterning process or an EUV to form a plurality of second masks, each of which may extend in the first direction, spaced apart from each other in the second direction. The etch stop lines 172, the mold lines 162, the first filling lines 212, the spacer lines 202, and the first conductive layer structure 140 may be etched using the second masks as an etching mask.

The etching process may be performed until an upper surface of the first insulating interlayer 110 is exposed, and then an upper portion of the first insulating interlayer 110 may be also etched. By the etching process, the etch stop line 172, the mold line 162, the first filling line 212, and the spacer line 202, each of which may extend in the second direction, may be transformed into a plurality of etch stop patterns 174, a plurality of molds 164, a plurality of first filling patterns 214, and a plurality of spacers 204, each of which may be spaced apart from each other in the second direction.

In an implementation, the first conductive layer structure 140 may be transformed into a plurality of first conductive line structures 142, each of which may extend (e.g., lengthwise) in the first direction, and may be spaced apart from each other in the second direction, e.g., the etching process may convert the first conductive line structure 140 into the plurality of first conductive line structures 142. Each of the first conductive line structures 142 may include a first conductive line 122, an adiabatic line 132, and another first conductive line 122 sequentially stacked. In an implementation, each of the first conductive line structures 142 may serve as a word line of the variable resistance memory device. In an implementation, each of the first conductive line structures 142 may serve as a bit line of the variable resistance memory device.

The first conductive line structure 142, the molds 164, the etch stop patterns 174, the first filling patterns 214, and the spacers 204 stacked on the first insulating interlayer 110 may be referred to as a second stacked structure. In an implementation, the second stacked structure may extend in the first direction, and a plurality of second stacked structures may be spaced apart from each other in the second direction. A second opening 220 may be between neighboring ones of the second stacked structures in the second direction to expose an upper surface of the first insulating interlayer 110.

Figure 8:
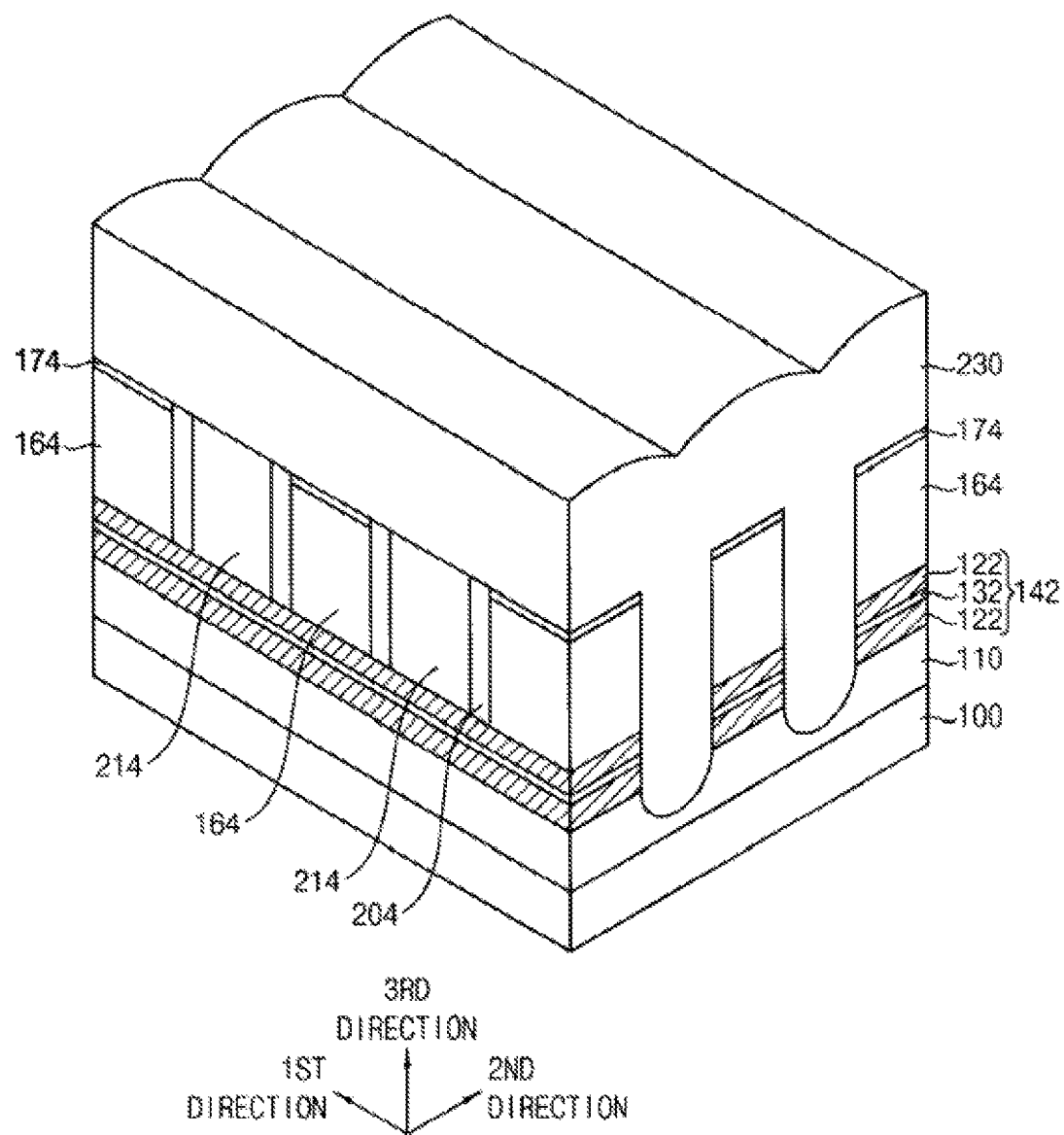

Referring to FIG. 8, a second filling layer 230 may be formed on the first insulating interlayer 110 and the second stacked structure to fill the second opening 220.

The second filling layer 230 may include, e.g., silicon nitride, silicon oxycarbide, or the like. In an implementation, the second filling layer 230 may include substantially the same material as the first filling pattern 214, and may be merged therewith.

Figure 9:
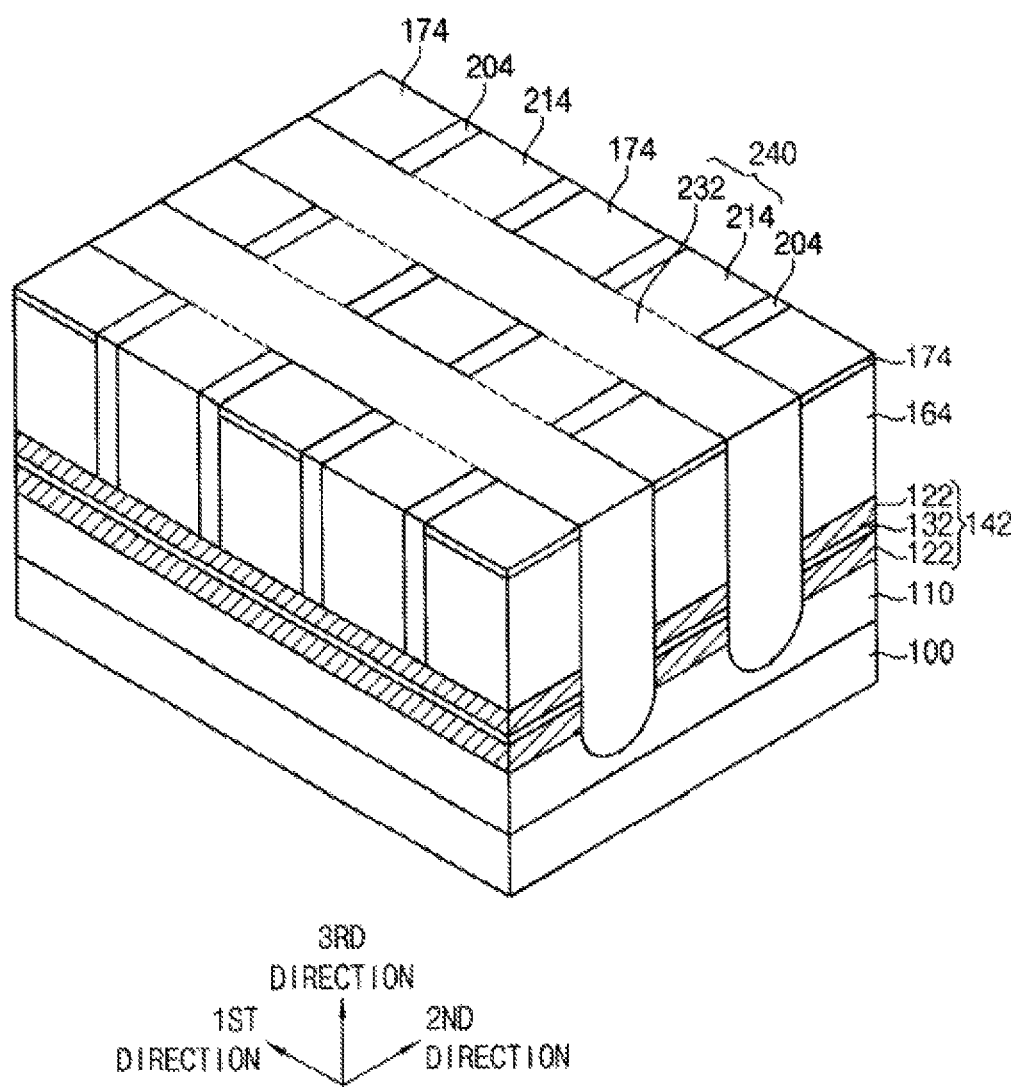

Referring to FIG. 9, an upper portion of the second filling layer 230 may be planarized to form a plurality of second filling lines 232, each of which may extend in the first direction, spaced apart from each other in the second direction.

The planarization process may include, e.g., a CMP process and/or an etch back process. The planarization process may be performed until an upper surface of the etch stop pattern 174 is exposed. For example, each of the molds 164 and the first filling patterns 214 may have a uniform height with no or little distribution depending on locations thereof, when the planarization process is performed.

As described above, the second filling layer 230 may be merged with the first filling pattern 214, and may form a filling structure 240. The second filling layer 230 and the first filling pattern 214 may be referred to as a first portion 232 and a second portion 214, respectively, of the filling structure 240.

The first portion 232 of the filling structure 240 may cover each of opposite sidewalls of the second stacked structure in the second direction, and the second portion 214 of the filling structure 240 may cover a sidewall of the spacer 204 in the first direction. In an implementation, a bottom surface of the first portion 232 of the filling structure 240 may be lower than a bottom surface of the first conductive line structure 142 (e.g., a distance from the substrate 100 to the bottom surface of the first portion 232 of the filling structure 240 in the third direction may be less than a distance from the substrate 100 to the bottom surface of the first conductive line structure 142 in the third direction), and may be also lower than a bottom surface of the second portion 214 of the filling structure 240 contacting an upper surface of the first conductive line structure 142.

Figure 10:
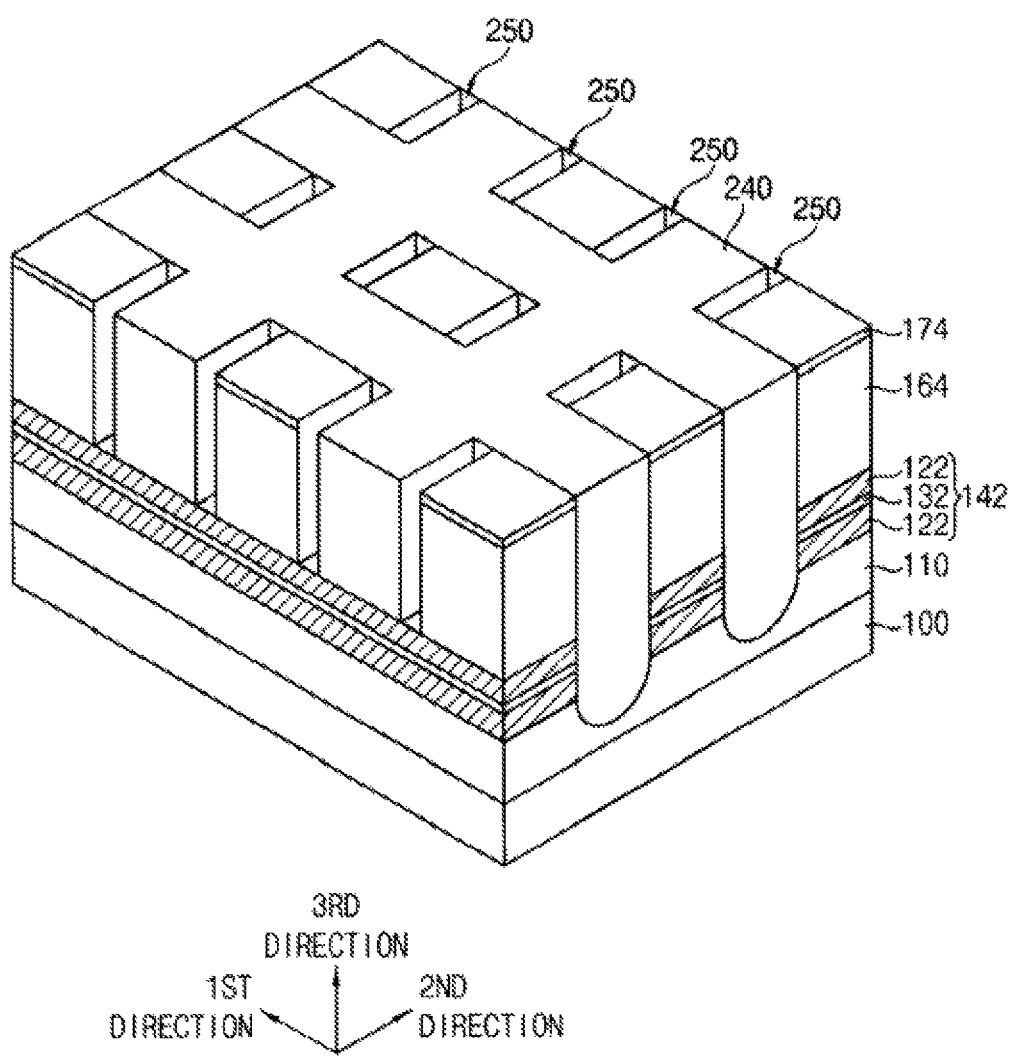

Referring to FIG. 10, the spacers 204 may be removed to form third openings 250, respectively, exposing an upper surface of the first conductive line structure 142.

In an implementation, the spacers 204 may be removed by a wet etching process. The first conductive line structure 142 under the spacers 204 may serve as an etch stop pattern, and the third openings 250, which may be formed by the wet etching process, may have a uniform depth with no or little distribution depending on locations thereof.

Figure 11:
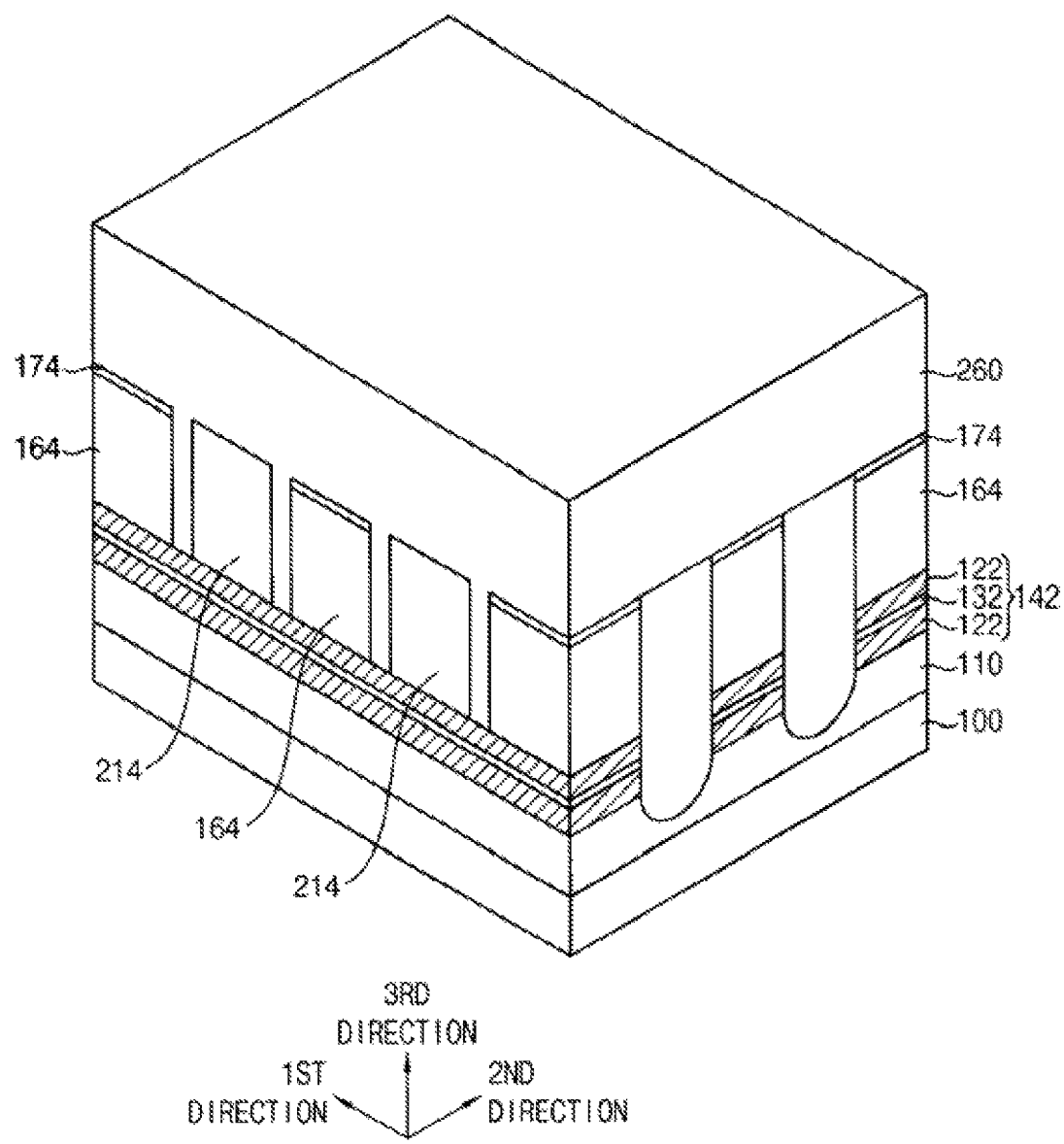

Referring to FIG. 11, a variable resistance layer 260 may be formed on the first conductive line structures 142, the etch stop patterns 174, and the filling structure 240 to till the third opening 250.

In an implementation, the variable resistance layer 269 may include a phase change material of which a resistance may change according to the phase thereof. In an implementation, the variable resistance layer 260 may include a chalcogenide-based material in which germanium (Ge), antimony (Sb), or tellurium (Te) may be combined in a given ratio. In an implementation, the variable resistance layer 260 may include a super lattice in which germanium-tellurium (GeTe) and antimony-tellurium (SbTe) may be repeatedly stacked. In an implementation, the variable resistance layer 260 may include IST containing indium-antimony-tellurium, or BST containing bismuth-antimony-tellurium. The variable resistance layer 260 may further include, e.g., carbon (C), nitride (N), boron (B), oxygen (O), or the like.

In an implementation, the variable resistance layer 260 may include a perovskite material or a transition metal oxide. The perovskite material may include, e.g., STO (SrTiO$_3$), BTO (BaTiO$_3$), PCMO (Pr$_{1-x}$Ca$_x$MnO$_3$), or the like. The transition metal oxide may include, e.g., titanium oxide (TiO$_x$), zirconium oxide (ZrO$_x$), aluminum oxide (AlO$_x$), hafnium oxide (HfO$_x$), or the like. These may be used alone or in a combination thereof.

Figure 12:
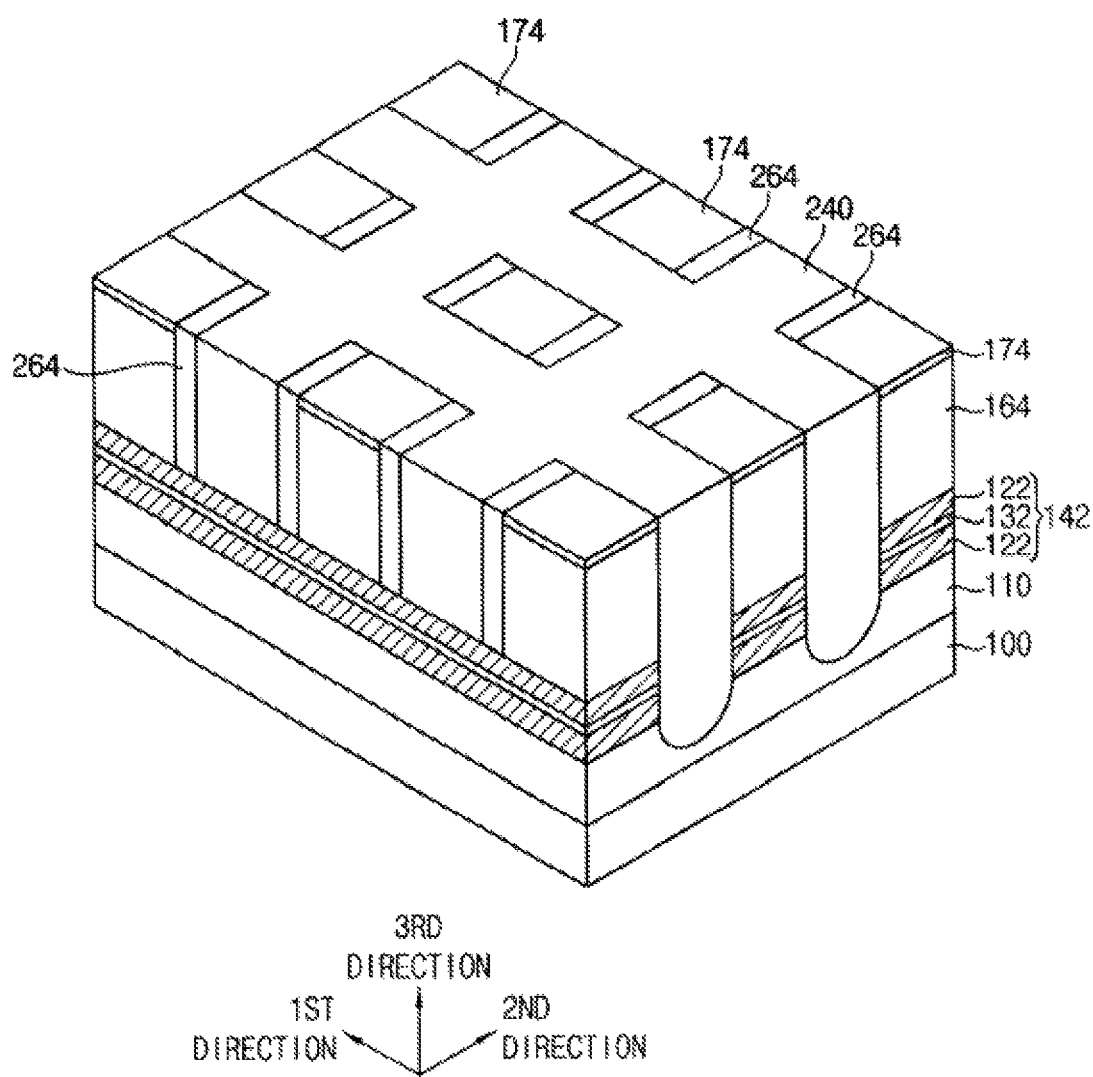

Referring to FIG. 12, an upper portion of the variable resistance layer 260 may be planarized to form a plurality of variable resistance patterns 264 arranged in each of the first and second directions.

The planarization process may include a CMP process and/or an etch back process. The planarization process may be performed until an upper surface of the etch stop pattern 174 is exposed. For example, the variable resistance patterns 264 may have a uniform height with no or little distribution depending on locations thereof, after the planarization process.

Figure 13:
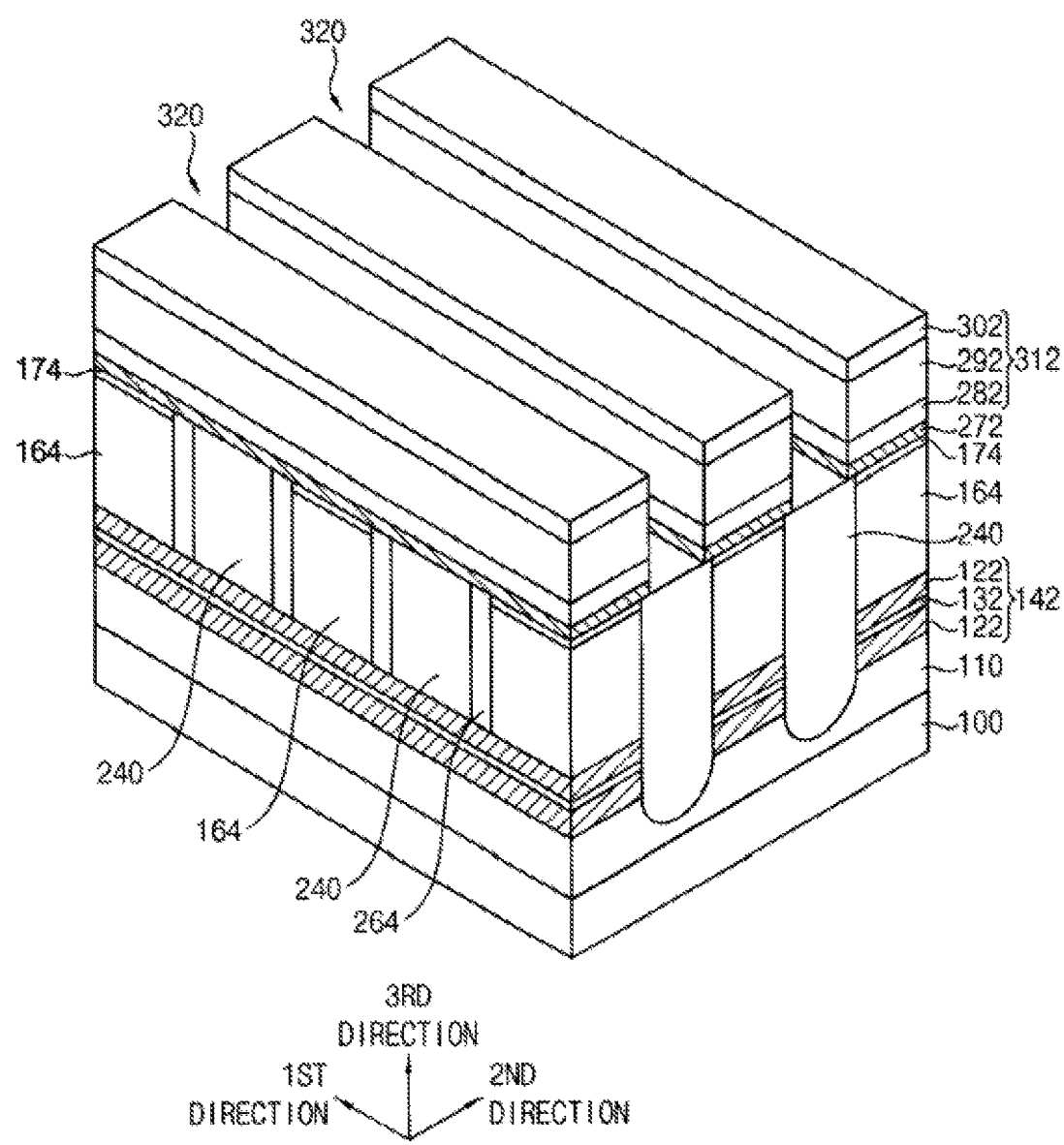

Referring to FIG. 13, a low resistance layer and a selection layer structure may be formed on the etch stop patterns 174, the variable resistance patterns 264, and the filling structure 240. A third mask layer may be formed on the selection layer structure, and may be patterned by a photolithography process using a double patterning process or an EUV to form a plurality of third masks, each of which may extend in the first direction, spaced apart from each other in the second direction.

The selection layer structure and the low resistance layer may be etched by an etching process using the third masks as an etching mask to form a selection line structure 312 and a low resistance line 272, respectively, and the low resistance line 272 and the selection line structure 312 sequentially stacked may be referred to as a third stacked structure. In an implementation, the third stacked structure may extend in the first direction, and a plurality of third stacked structures may be spaced apart from each other in the second direction. A fourth opening 320 may be formed between neighboring ones of the third stacked structures in the second direction to expose an upper surface of the filling structure 240.

In an implementation, the third stacked structure may be on the variable resistance patterns 264 and the etch stop patterns 174 arranged in the first direction and portions of the filling structure 240 therebetween. A width in the second direction of the third stacked structure may be equal to or greater than a width in the second direction of each of the variable resistance patterns 264 and each of the etch stop patterns 174.

The low resistance line 272 may include a metal having a resistance lower than that of the variable resistance pattern 264. In an implementation, the low resistance line 272 may include substantially the same metal as the first conductive layer 120, e.g., tungsten, platinum, copper, aluminum, titanium, tantalum, or the like.

The selection line structure 312 may include a first buffer line 282, a selection line 292, and a second buffer line 302 sequentially stacked.

Each of the first and second buffer lines 282 and 302 may include, e.g., carbon, carbon compounds, or a metal containing carbon. For example, each of the first and second buffer lines 282 and 302 may include carbon, carbonitride, titanium carbonitride, or tantalum carbonitride. In an implementation, the first buffer line 282 may include a same material having a low heat conductivity as the adiabatic line 132, and heat transferred from the low resistance line 272 may be prevented from being discharged out of the selection line structure 312.

In an implementation, the selection line 292 may include an OTS material, which may serve as a switching function due to a resistance difference depending on an applied voltage while maintaining an amorphous state.

The OTS material may include, e.g., germanium (Ge), silicon (Si), arsenic (As), or tellurium (Te), and may further include selenium (Se), sulfur (S), carbon (C), nitrogen (N), indium (In), boron (B), or the like.

The OTS material may include, e.g., AsTeGeSiIn, GeTe, SnTe, GeSe, SnSe, AsTeGeSiSbS, AsTeGeSiInP, AsTeGeSi, As$_2$Te$_3$Ge, As$_2$Se$_3$Ge, As$_{25}$(Te$_{90}$Ge$_{10}$)$_{75}$, $Te_{40}As_{35}Si_{18}Ge_{6.75}In_{0.25}$, $Te_{39}As_{36}Si_{17}Ge_7P$, $As_{10}Te_{21}S_2Ge_{13}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, $Ge_xSe_{1-x}$, or the like.

Figure 14:
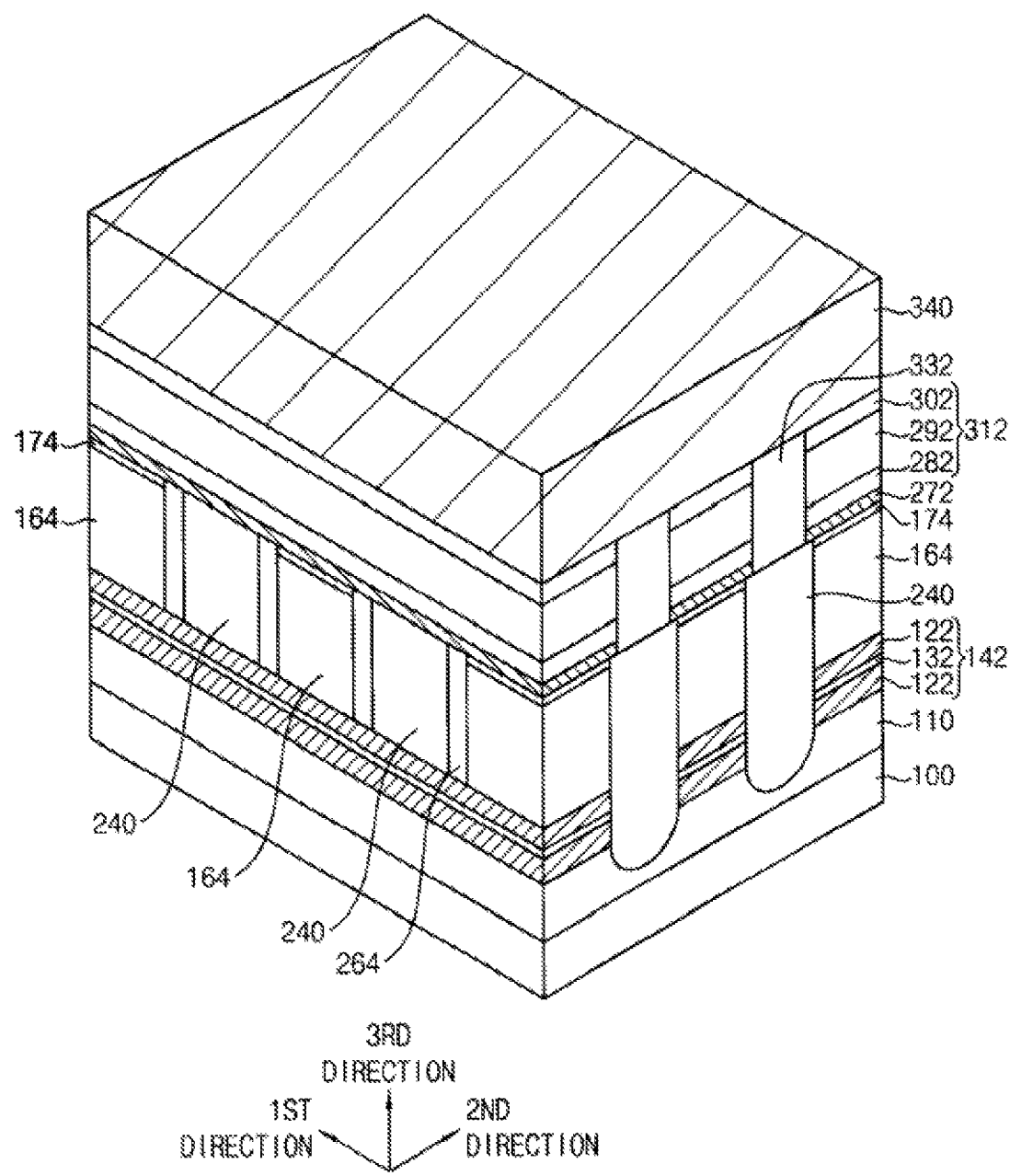

Referring to FIG. 14, a second insulating interlayer line 332 may be formed to fill the fourth opening 320, and a second conductive layer 340 may be formed on the third stacked structures and the second insulating interlayer lines 332.

The second insulating interlayer line 332 may include an oxide, e.g., silicon oxide, and the second conductive layer 340 may include a metal, e.g., tungsten, platinum, copper, aluminum, titanium, tantalum, or the like. In an implementation, a second barrier layer may be further formed to cover a bottom surface of the second conductive layer 340.

Figure 15:
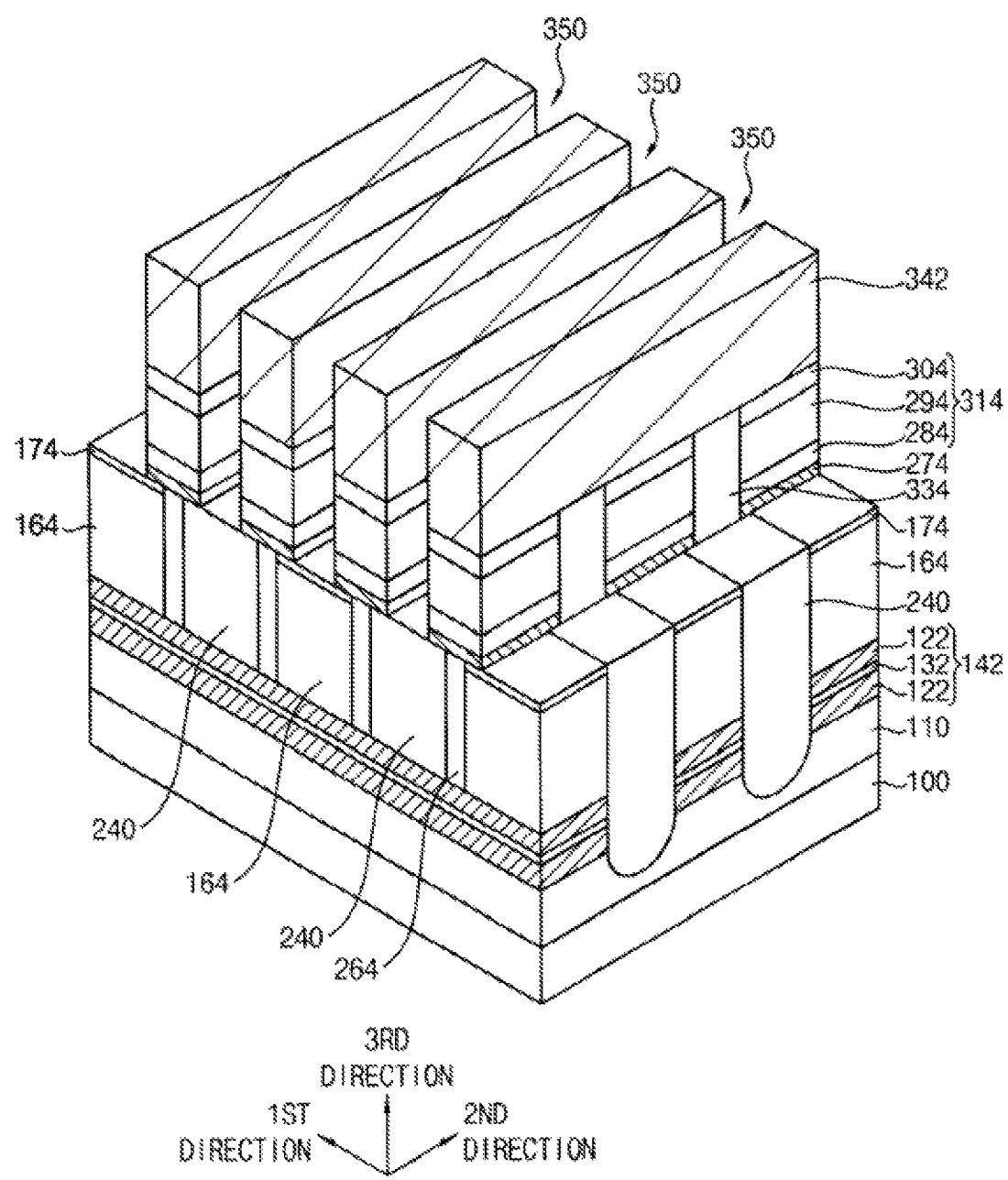

Referring to FIG. 15, a fourth mask layer may be formed on the second conductive layer 340, and may be patterned by a photolithography process using a double patterning process or an EUV to form a plurality of fourth masks, each of which may extend in the second direction, spaced apart from each other in the first direction. The second conductive layer 340, the selection line structure 312, the low resistance line 272, and the second insulating interlayer line 332 may be etched using the fourth masks as an etching mask to form a second conductive line 342, a selection structure 314, a low resistance pattern 274, and a second insulating inter layer pattern 334, respectively.

The second conductive line 342 may extend in the second direction, and a plurality of second conductive lines 342 may be formed to be spaced apart from each other in the first direction. A plurality of low resistance patterns 274, a plurality of selection structures 314, and a plurality of second insulating interlayer patterns 334 may be formed in each of the first and second directions. The selection structure 314 may include a first buffer 284, a selection pattern 294, and a second buffer 304 sequentially stacked.

The low resistance pattern 274, the selection structure 314, the second insulating interlayer pattern 334, and the second conductive line 342 may be referred to as a fourth stacked structure. The fourth stacked structure may extend in the second direction, and a plurality of fourth stacked structures may be formed to be spaced apart from each other in the first direction. A fifth opening 350 may be between neighboring ones of the fourth stacked structures in the first direction to expose an upper surface of the filling structure 240.

In an implementation, the fourth stacked structure may be on the variable resistance patterns 264 arranged in the second direction and portions of the filling structure 240 therebetween. A width in the first direction of the fourth stacked structure may be equal to or greater than a width in the first direction of the variable resistance pattern 264.

In an implementation, the second conductive line 342 may serve as a bit line of the variable resistance memory device. In an implementation, the second conductive line 342 may serve as a word line of the variable resistance memory device.

In an implementation, a capping layer may be formed on the etch stop patterns 174 and the filling structure 240 to cover the fourth stacked structure, a third insulating interlayer may be formed on the capping layer to fill the fifth opening 350, and the third insulating interlayer and the capping layer may be planarized until an upper surface of the fourth stacked structure may be exposed.

The capping layer may include, e.g., amorphous silicon, or a nitride such as silicon nitride, silicon oxynitride, silicon carbonitride, silicon boronitride, or the like. Due to the capping layer, the selection pattern 294 of the fourth stacked structure may be prevented from being oxidized, and moisture or chemical residue may be prevented from infiltrating into the selection pattern 294. The third insulating interlayer may include an oxide, e.g., silicon oxide.

By the above processes, the variable resistance memory device may be manufactured.

As described above, the upper portion of the first opening 190 may be enlarged so that no seam or void may be generated in the first filling layer 210 in the first opening 190, or seam or void may be generate at the upper portion of the first opening 190 so as to be removed during the planarization process for the first filling layer 210. The etch stop line 172 may be formed on the mold line 162 so that the first filling lines 212, which may be formed by a planarization process for the first filling layer 210, may have a uniform height with no or little distribution depending on locations thereof.

When the etch stop lines 172, the mold lines 162, the first filling lines 212, and the spacer lines 202 are etched to form the etch stop patterns 174, the molds 164, the first filling patterns 214, and the spacers 204, respectively, the first conductive layer structure 140 may be also etched to form the first conductive line structure 142, and the entire processes may be simplified when compared to performing an additional etching process for the first conductive layer structure 140.

In an implementation, the etch stop pattern 174 may be formed on the mold 164, and the second filling lines 232, which may be formed by planarizing the second filling layer 230, and the molds 164 adjacent thereto may have a uniform height with no or little distribution depending on locations thereof.

During the wet etching process for removing the spacers 204 to form the third openings 250, the first conductive line structure 142 under the spacers 204 may serve as an etch stop pattern, and the third openings 250 may have a uniform depth with no or little distribution depending on locations thereof, and the variable resistance patterns 265 in the respective third openings 250 may have also a uniform thickness.

In an implementation, only the variable resistance pattern 264 may be formed in the third opening 250, and the spacer 204 from which the third opening 250 may be formed or the mold line 162 having a similar height may have a low aspect ratio. For example, each of the first filling layer 210 filling the first opening 190 between the mold lines 162, the second filling layer 230 filling the second opening 220 between the second stacked structures, and the variable resistance pattern 264 filling the third opening 250 may have no seam or void therein.

In the variable resistance memory device manufactured by the above processes, the variable resistance pattern 264 may be between the first conductive line structure 142 and the low resistance pattern 274, each of which may have a relatively low resistance. For example, when electrical signals are applied to the first and second conductive lines 122, 342, heat may be generated in the variable resistance pattern 264 even with no heating by external electrodes, and the phase of the variable resistance pattern 264 may be changed due to the generated heat. As a result, the variable resistance pattern 264 may serve as a memory unit of the variable resistance memory device.

In order to prevent the generated heat from being discharged outwardly, the first conductive line structure 142 (under the variable resistance pattern 264) may include the adiabatic line 132 having a low heat conductivity, and the first buffer 284 may be on the low resistance pattern 274 on the variable resistance pattern 264.

The variable resistance memory device may have the following structural characteristics.

The variable resistance memory device may include the first conductive line structures 142, each of which may extend in the first direction, spaced apart from each other in the second direction on the substrate 100, the second conductive lines 342, each of which may extend in the second direction, spaced apart from each other in the first direction on the first conductive line structures 142, the variable resistance patterns 264 between the first conductive line structures 142 and the second conductive lines 342 at areas where the first conductive line structures 142 and the second conductive lines 342 overlap or cross each other in the third direction and contacting upper surfaces of corresponding ones of the first conductive line structures 142, the filling structure 240 having the first portion 232 extending in the first direction between the first conductive line structures 142 on the substrate 100 and contacting each of opposite sidewalls of the variable resistance patterns 264 in the second direction, and the second portions 214 extending in the second direction from the first portion 232 on the first conductive line structures 142 to contact sidewalls of corresponding ones of the variable resistance patterns 264 in the first direction, the molds 164 on each of the first conductive line structures 142 and contacting sidewalls in the first direction of the variable resistance patterns 264, respectively, not contacting the second portions 214 of the filling structure 240, the etch stop pattern 174 on each of the molds 164, the low resistance pattern 274 contacting an upper surface of each of the variable resistance patterns 264, and the selection structure 314 on the low resistance pattern 274.

In an implementation, each of the first conductive line structures 142 may include the first conductive line 122, the adiabatic line 132, and the first conductive line 122 sequentially stacked in the third direction, and the selection structure 314 may include the first buffer 284, the selection pattern 294, and the second buffer 304 sequentially stacked in the third direction.

In an implementation, a bottom surface of the low resistance pattern 274 may cover an entire upper surface of a corresponding (e.g., underlying) one of the variable resistance patterns 264, and may have an area substantially equal to or greater than the upper surface of the corresponding one of the variable resistance patterns 264, and may contact a portion of an upper surface of the etch stop pattern 174.

In an implementation, a bottom surface of the first portion 232 of the filling structure 240 may be lower than a bottom surface of the first conductive line structure 142, and may be lower titan a bottom surface of the second portion 214 of the filling structure 240 contacting an upper surface of the first conductive line structure 142.

In an implementation, in a plan view, tire selection structure 314 and the low resistance pattern 274 may have substantially the same shape and area.

In an implementation, the mold 164 and die filling structure 240 may be alternately formed between neighboring ones of the variable resistance patterns 264.

In an implementation, the first insulating interlayer 110 may be on the substrate 100, and may cover bottom surfaces of the first conductive line structure 142 and the first portion 232 of the filling structure 240.

FIGS. 16 to 20 illustrate perspective views of stages in a method of manufacturing a variable resistance memory device in accordance with example embodiments. This method of manufacturing the variable resistance memory device includes processes substantially the same as or similar to the processes used in the method of manufacturing the variable resistance memory device described in FIGS. 1 to 15, and repeated descriptions thereon may be omitted herein.

Figure 16:
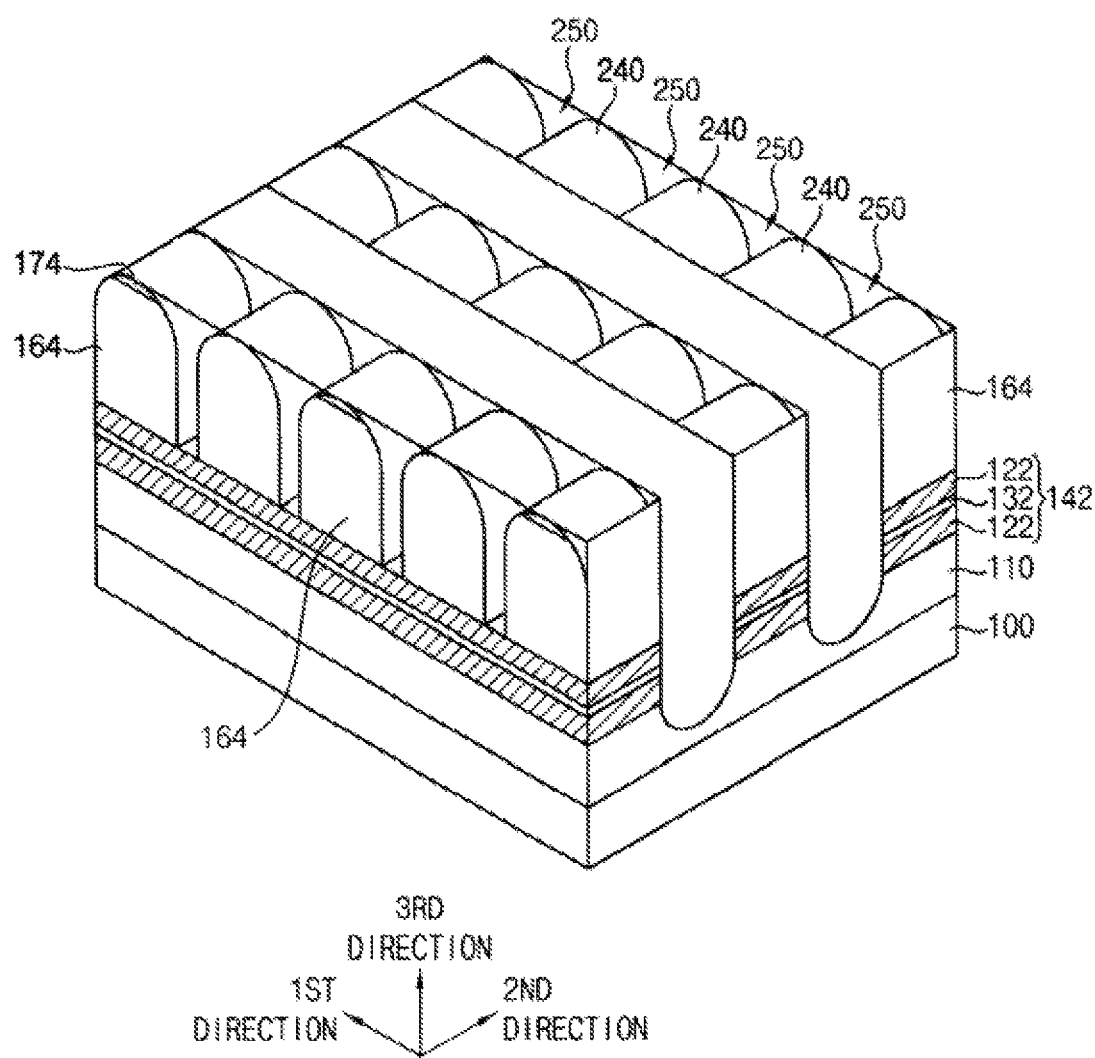
FIGS. 16 to 20 illustrate perspective views of stages in a method of manufacturing a variable resistance memory device in accordance with example embodiments.

Referring to FIG. 16, processes substantially the same as or similar to those illustrated with reference to FIGS. 1 to 10 may be performed, and a structure including the mold 164 and the etch stop pattern 174 and the filling structure 240 may be partially removed by, e.g., an etch back process. For example, an entrance of the third opening 250, e.g., an upper portion of the third opening 250 may be enlarged.

Figure 17:
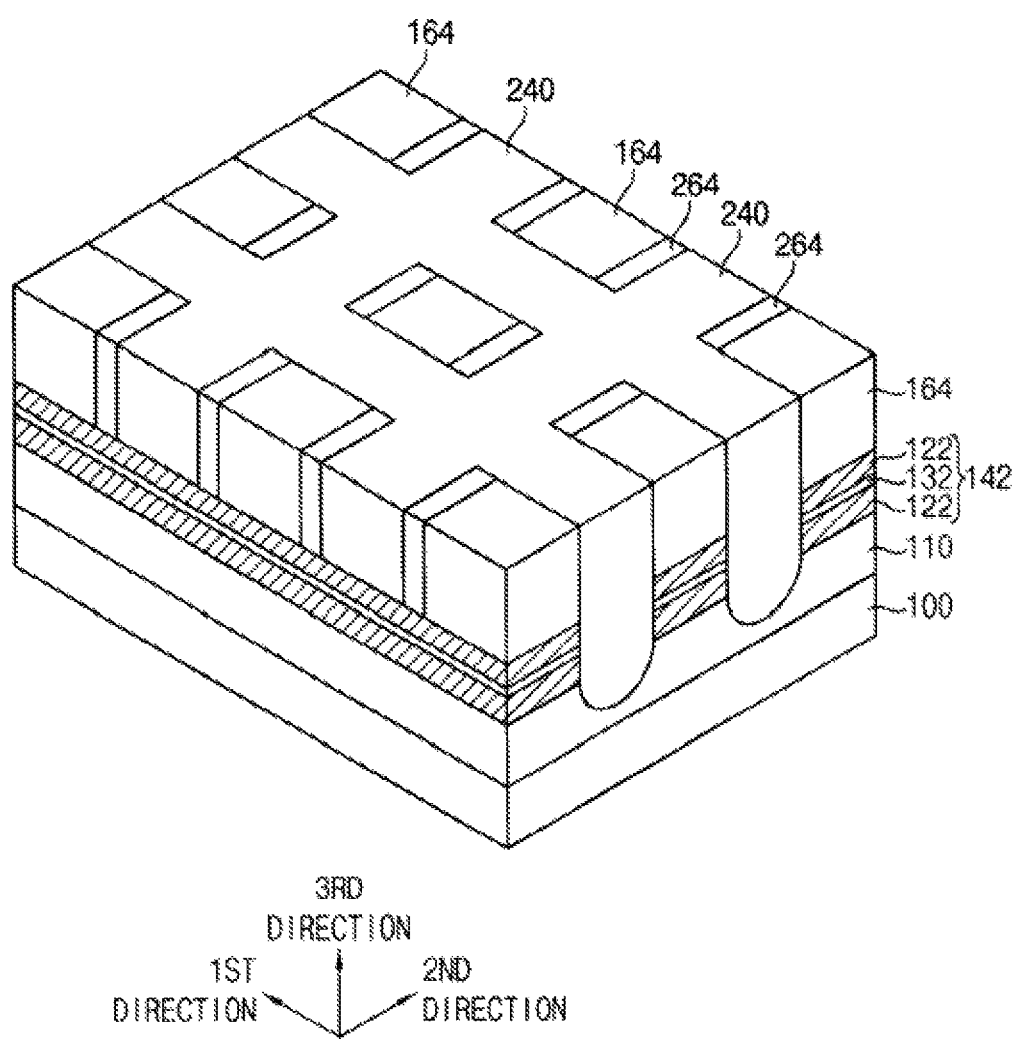

Referring to FIG. 17, processes substantially the same as or similar to those illustrated with reference to FIG. 11 may be performed to form the variable resistance layer 260 filling the third openings 250. As illustrated above, the upper portions of the third openings 250 have been enlarged so that no seam or void may be generated in the variable resistance layer 260.

Processes substantially the same as or similar to those illustrated with reference to FIG. 12 may be performed to planarize the upper portion of the variable resistance layer 260, and the variable resistance pattern 264 may be formed in each of the third openings 250. In an implementation, the etch stop pattern 174 may be also removed during the planarization process.

Figure 18:
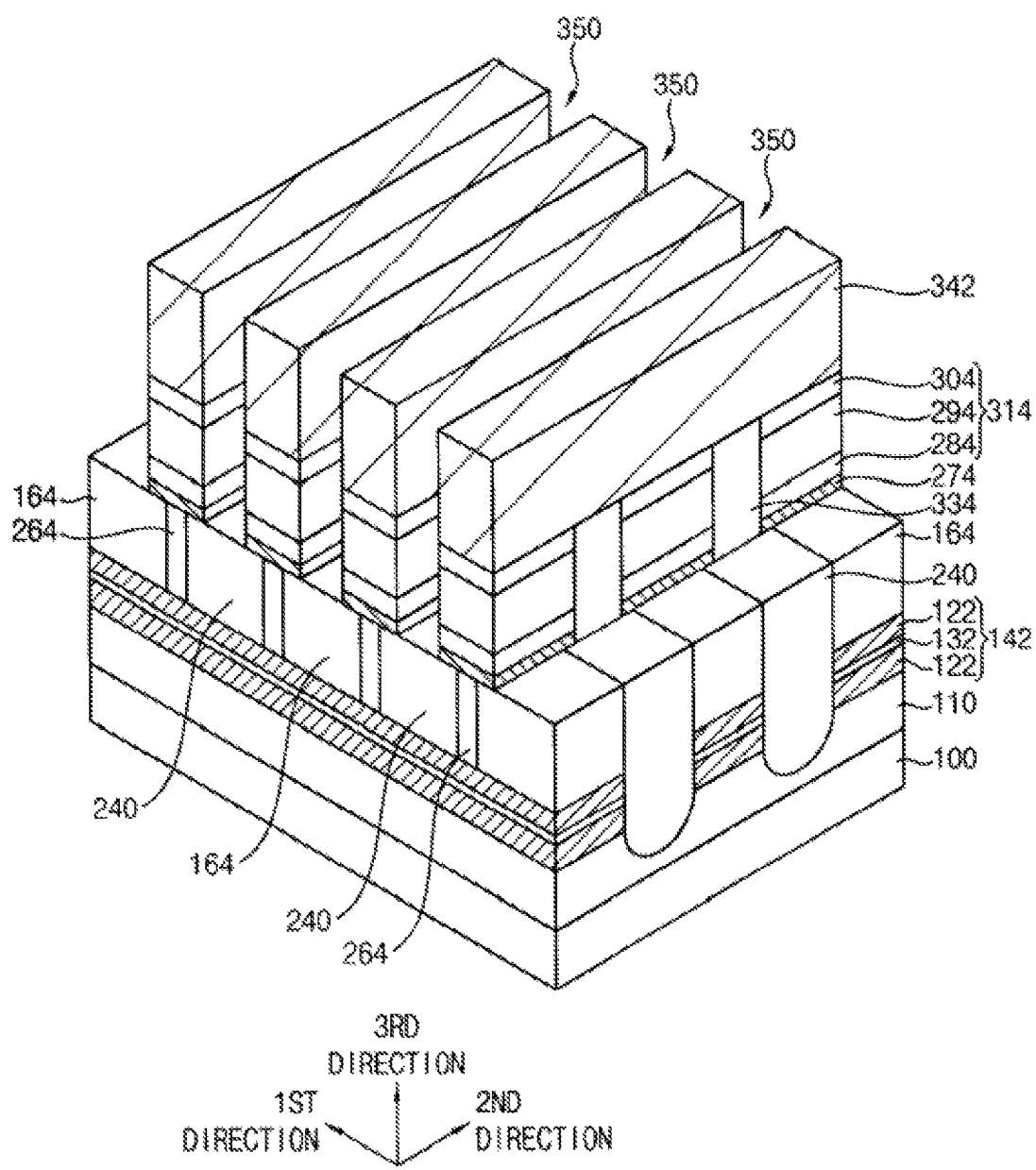

Referring to FIG. 18, processes substantially the same as or similar to those illustrated with reference to FIGS. 13 to 15 may be performed to complete the fabrication of the variable resistance memory device.

Figure 19:
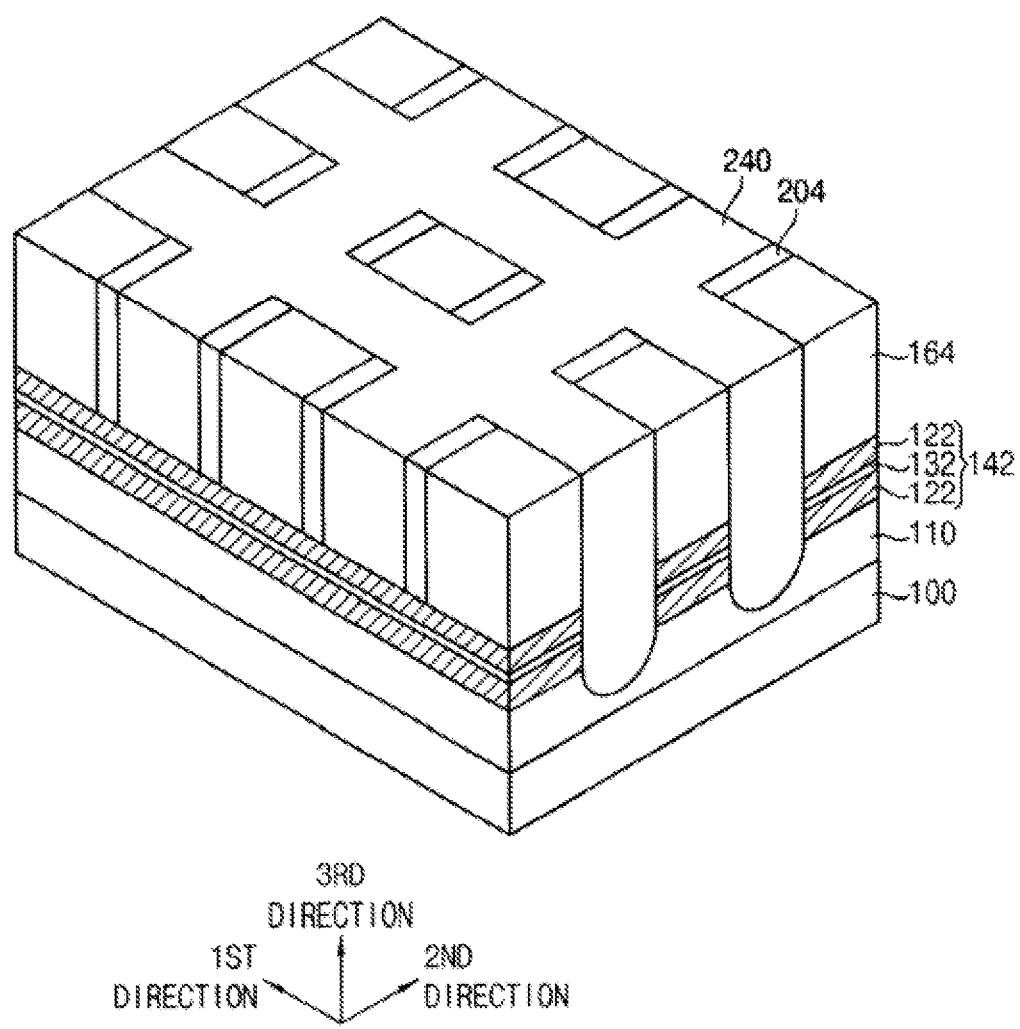

In an implementation, referring to FIG. 19, before performing the etch back process illustrated with reference to FIG. 16. the etch stop pattern 174 remaining on the mold 164 may be removed.

Figure 20:
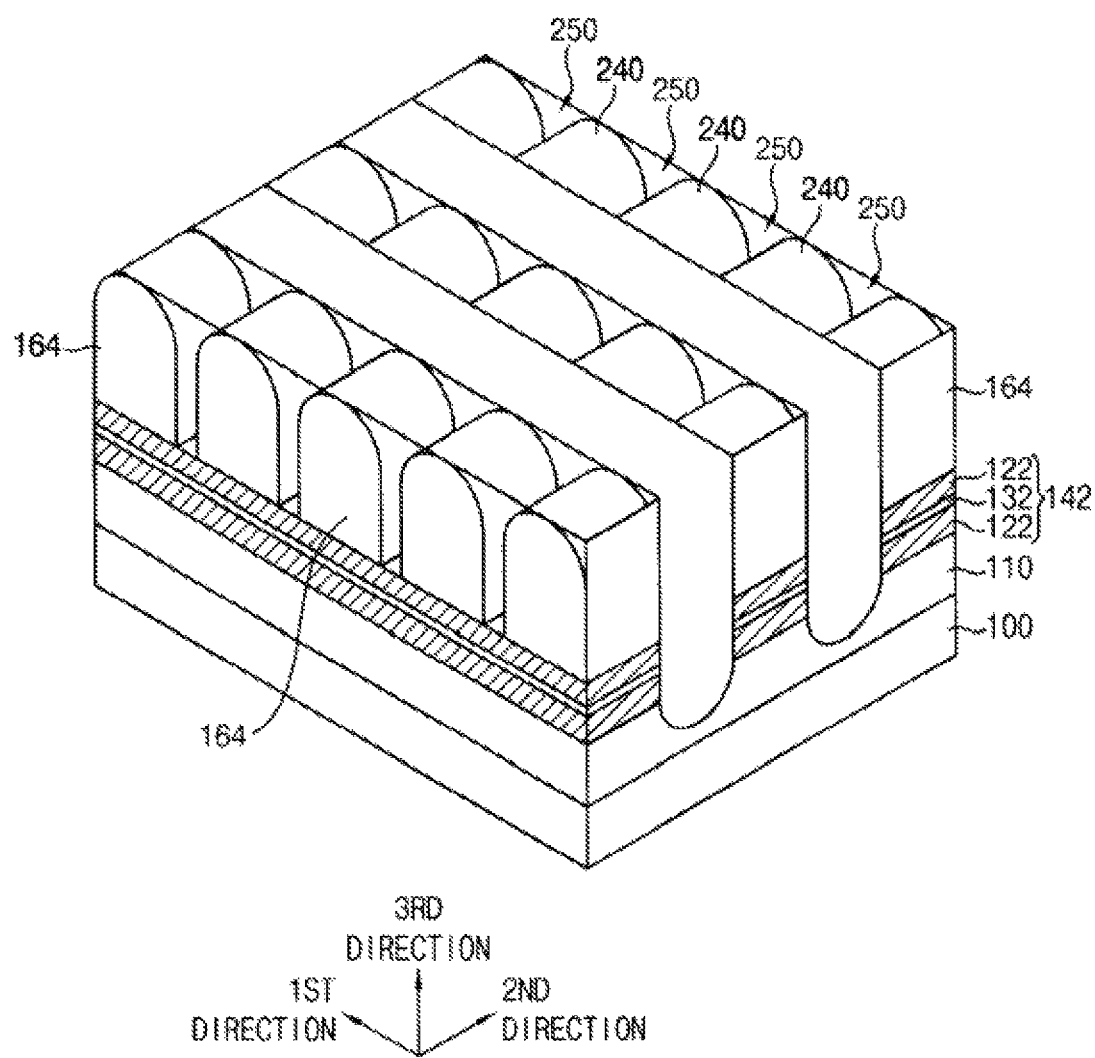

Referring to FIG. 20, the etch back process of FIG. 16 may be performed on the mold 164 and the filling structure 240. The etch stop pattern 174 has been removed, and the etch back process on the mold 164 may be easily performed.

Figure 21:
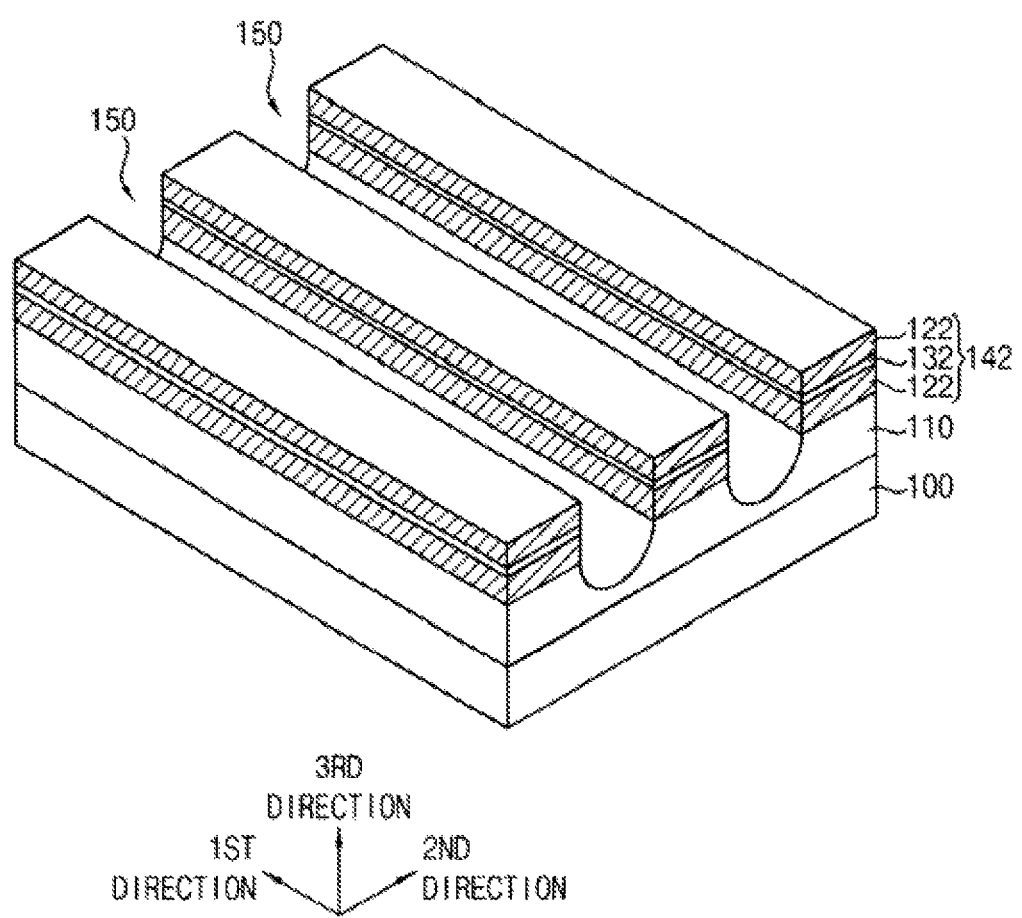
FIGS. 21 to 23 illustrate perspective views of stages in a method of manufacturing a variable resistance memory device in accordance with example embodiments.
Figure 22:
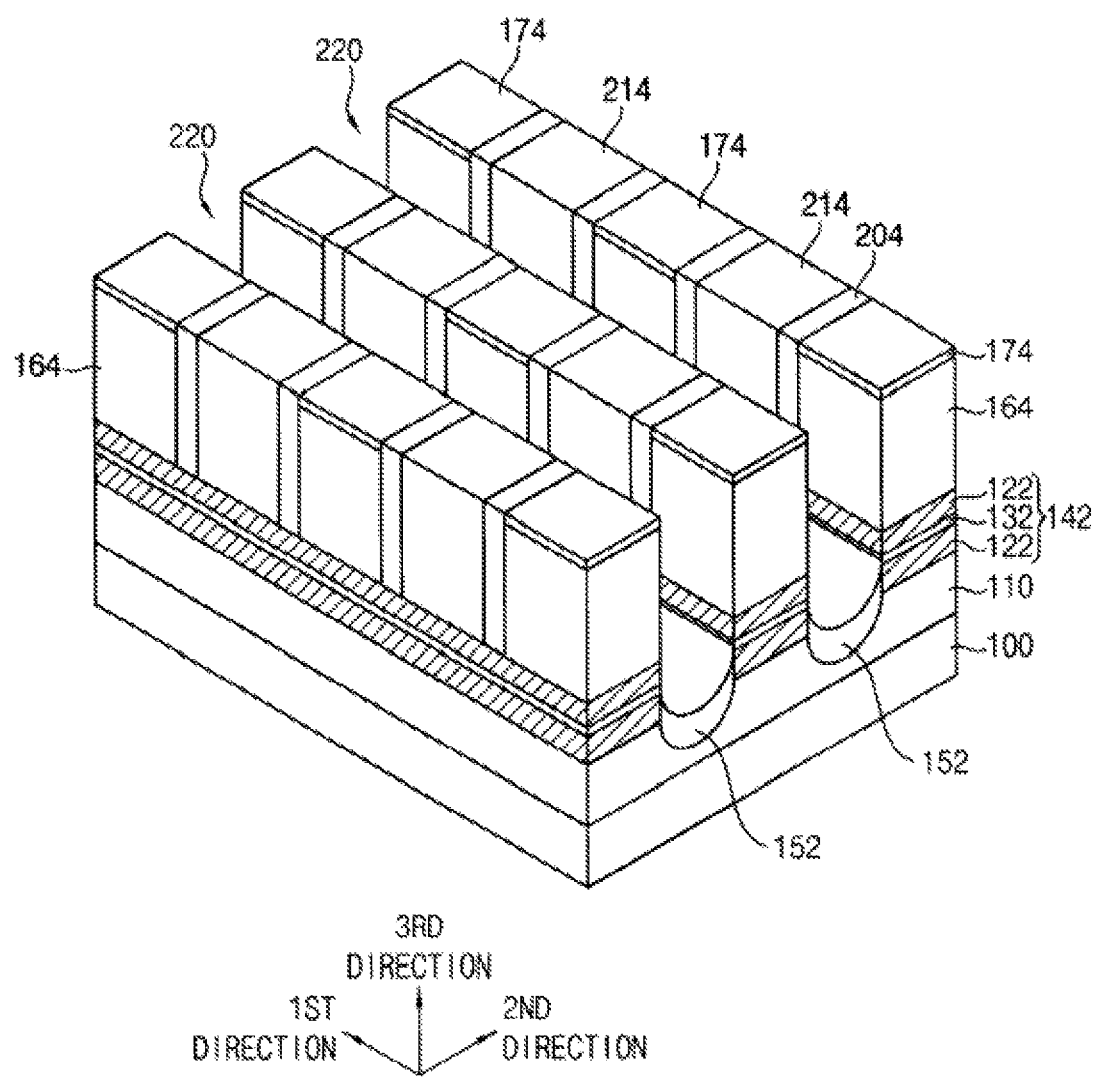
Figure 23:
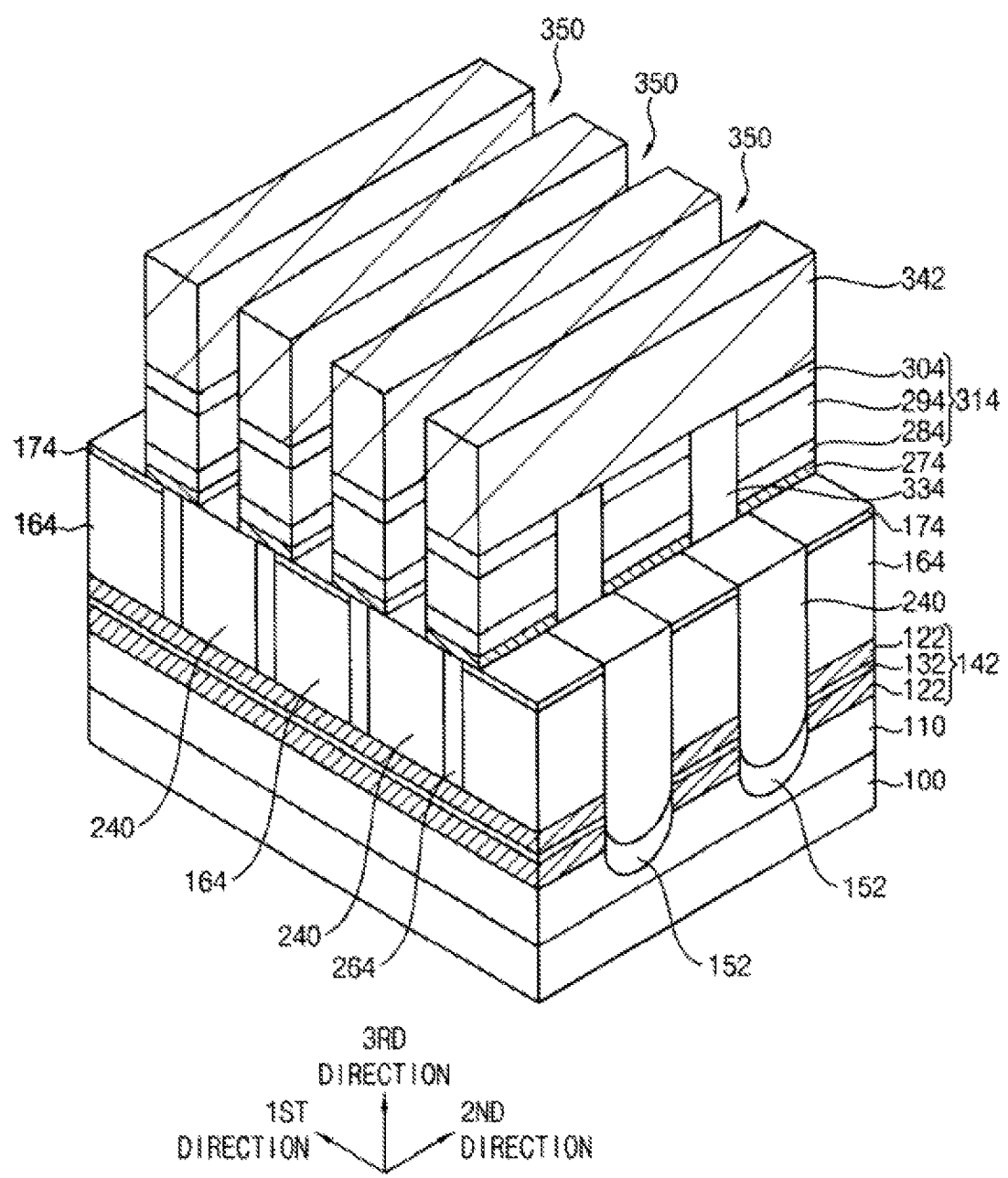

FIGS. 21 to 23 illustrate perspective views of a method of manufacturing a variable resistance memory device in accordance with example embodiments. This method may include processes substantially the same as or similar to those illustrated with reference to FIGS. 1 to 15, and repeated descriptions thereon may be omitted herein.

Referring to FIG. 21, the first insulating interlayer 110 and the first conductive layer structure 140 may be sequentially formed on the substrate 100.

A fifth mask layer may be formed on the first conductive layer structure 140, and may be patterned by a photolithography process using a double patterning process or an EUV to form a plurality of fifth masks, each of which may extend in the first direction, spaced apart from each other in the second direction. An etching process may be performed on the first conductive layer structure 140 using the fifth masks as an etching mask to form the first conductive line structure 142. During the etching process, an upper portion of the first insulating interlayer 110 may be also partially removed.

A sixth opening 150 may be formed between neighboring ones of the first conductive line structures 142, each of which may extend in the first direction, to expose an upper surface of the first insulating interlayer 110.

Referring to FIG. 22, a fourth insulating inter layer line 152 may be formed to fill the sixth opening 150, the mold layer 160, the etch stop layer 170, and the first mask layer 180 may be sequentially stacked on the first conductive line structures 142 and the fourth insulating interlayer lines 152, and processes substantially the same as or similar to those illustrated with reference to FIGS. 2 to 7 may be performed. The fourth insulating interlayer line 152 may include an oxide, e.g., silicon oxide or a nitride, e.g., silicon nitride.

In an implementation, the etching process of FIG. 7 may be performed until an upper surface of the fourth insulating interlayer line 152 is exposed, and an upper portion of the fourth insulating interlayer line 152 may be partially etched during the etching process. For example, the second opening 220 formed by the etching process may have a depth and an aspect ratio less than those of the second opening 220 formed by the etching process illustrated with reference to FIG. 7.

In an implementation, a lowermost surface of the fourth insulating inter layer 152 (e.g., surface closest to the substrate 100 in the third direction) may be lower than a bottom surface of the first conductive line structure 142, and an uppermost surface of the fourth insulating interlayer line 152 (e.g., surface farthest from the substrate 100 in the third direction) may be lower than an upper surface of the first conductive line structure 142.

Referring to FIG. 23, processes substantially the same as or similar to those illustrated with reference to FIGS. 8 to 15 may be performed to complete the fabrication of the variable resistance memory device. As illustrated above, the second opening 220 may have a relatively low aspect ratio, and the possibility of formation of seam or void in the second filling layer 230 may decrease.

In an implementation, the processes illustrated with reference to FIGS. 16 to 20 may be also applied to the method of manufacturing the variable resistance memory device illustrated with reference to FIGS. 21 to 23.

The above variable resistance memory device may be applied to PRAM devices, ReRAM devices, MRAM devices, or the like.

By way of summation and review, as the aspect ratio of a mold increases, a seam could be formed in a material filling an opening in the mold, and could also be enlarged in subsequent processes to cause an electrical short between neighboring upper electrodes.

One or more embodiments may provide a variable resistance memory device having improved characteristics.

In the variable resistance memory device in accordance with example embodiments, only the variable resistance pattern (e g., a self-heating variable resistance pattern) may be formed between the word line and the low resistance pattern, the aspect ratio of the mold or the filling structure for forming the variable resistance pattern may decrease, and no seam or void may be generated in the filling structure and/or the variable resistance pattern. For example, before forming the filling structure and/or the variable resistance pattern, the upper portion of the opening in which the filling structure and/or the variable resistance pattern may be formed may be enlarged so that the formation of the seam or void may be prevented.

By forming the etch stop pattern on the mold, the height distribution of the filling structures and the variable resistance patterns may be reduced, and during the etching process for removing the spacers to form the variable resistance patterns, the word line under the spacers may serve as an etch stop pattern, and the thickness distribution of the variable resistance patterns may be also reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may lie made without departing from the spirit and scope of the present invention as set forth in the following claims.

What is claimed is:

1. A variable resistance memory device, comprising:
a first conductive line structure on a substrate, the first conductive line structure having an adiabatic line and a first conductive line;
at least one variable resistance pattern contacting an upper surface of the first conductive line structure;
a low resistance pattern contacting an upper surface of the at least one variable resistance pattern;
a selection structure on the low resistance pattern; and
a second conductive line on the selection structure,
wherein the at least one variable resistance pattern and the adiabatic line are spaced apart from each other by the first conductive line.

2. The variable resistance memory device as claimed in claim 1, wherein:
the first conductive lines have a resistance lower than that of the at least one variable resistance pattern,
the adiabatic line has a heat conductivity lower than that of the first conductive lines, and
the at least one variable resistance pattern contacts an upper surface of the first conductive line.

3. The variable resistance memory device as claimed in claim 1, wherein the selection structure includes a first buffer, a selection pattern, and a second buffer that are sequentially stacked.

4. The variable resistance memory device as claimed in claim 3, wherein:
the first buffer has a heat conductivity lower than that of the low resistance pattern, and
a bottom surface of the first buffer contacts an upper surface of the low resistance pattern.

5. The variable resistance memory device as claimed in claim 1, wherein:
the first conductive line structure extends in a first direction substantially parallel to an upper surface of the substrate,
the at least one variable resistance pattern includes a plurality of variable resistance patterns spaced apart from each other in the first direction on the first conductive line structure, and
the second conductive line extends in a second direction substantially parallel to the upper surface of the substrate and crossing the first direction.

6. The variable resistance memory device as claimed in claim 5, wherein:
a plurality of first conductive line structures is spaced apart from each other in the second direction, and
a plurality of second conductive lines is spaced apart from each other in the first direction.

7. The variable resistance memory device as claimed in claim 5, wherein:
a plurality of low resistance patterns is spaced apart from each other in the second direction under each of the second conductive lines, and a plurality of selection structures is spaced apart from each other in the second direction under each of the second conductive lines.

8. The variable resistance memory device as claimed in claim 5, wherein widths of the low resistance pattern in the first direction and the second direction are substantially equal to or greater than widths of a corresponding one of the plurality of variable resistance patterns in the first direction and the second direction.

9. The variable resistance memory device as claimed in claim 5, further comprising a mold and a filling structure alternately arranged in respective spaces between neighboring ones of the plurality of variable resistance patterns in the first direction.

10. The variable resistance memory device as claimed in claim 9, wherein the filling structure includes;
a first portion extending in the first direction to contact each of opposite sidewalls in the second direction of the variable resistance patterns; and
a second portion covering a sidewall in the first direction of each of the plurality of variable resistance patterns.

11. The variable resistance memory device as claimed in claim 9, further comprising an etch stop pattern on the mold.

12. A variable resistance memory device, comprising:
a first conductive line structure on a substrate, the first conductive line structure extending in a first direction substantially parallel to an upper surface of the substrate;
variable resistance patterns spaced apart from each other in the first direction, each of the variable resistance patterns contacting an upper surface of the first conductive line structure;
a mold and a filling structure on the first conductive line structure, the mold and the filling structure being alternately arranged in respective spaces between neighboring ones of the variable resistance patterns in the first direction such that the mold is spaced apart from the filling structure in the first direction;
an etch stop pattern on the mold;
a low resistance pattern contacting an upper surface of a respective one of the variable resistance patterns; and
a selection structure on the low resistance pattern.

13. The variable resistance memory device as claimed in claim 12, wherein the low resistance pattern contacts a portion of an upper surface of the etch stop pattern.

14. The variable resistance memory device as claimed in claim 12, wherein a bottom surface of the low resistance pattern:
covers an entire upper surface of each of the variable resistance patterns, and
has an area substantially equal to or greater than that of the upper surface of each of the variable resistance patterns.

15. The variable resistance memory device as claimed in claim 12, wherein an upper surface of the etch stop pattern is substantially coplanar with an upper surface of the filling structure.

16. The variable resistance memory device as claimed in claim 12, wherein:
the first conductive line structure includes an adiabatic line between first conductive lines,
the first conductive lines have a resistance less than that of each of the variable resistance patterns,
the adiabatic line has a heat conductivity lower than that of the first conductive lines, and
each of the variable resistance pattern contacts an upper surface of one of the first conductive lines.

17. The variable resistance memory device as claimed in claim 12, wherein:
the selection structure includes a first buffer, a selection pattern, and a second buffer sequentially stacked,
the first buffer has a heat conductivity lower than that of the low resistance pattern, and
a bottom surface of the first buffer contacts an upper surface of the low resistance pattern.

18. A variable resistance memory device, comprising:
first conductive line structures spaced apart from each other in a second direction on a substrate, each of the first conductive line structures extending in a first direction, each of the first and second directions being substantially parallel to an upper surface of the substrate, and the first direction crossing the second direction;
second conductive lines spaced apart from each other in the first direction on the first conductive line structures, each of the second conductive lines extending in the second direction;
variable resistance patterns between the first conductive line structures and the second conductive lines at respective areas where the first conductive line structures and the second conductive lines overlap each other in a third direction substantially perpendicular to the upper surface of the substrate, the variable resistance patterns contacting upper surfaces of the first conductive line structures, respectively;
a filling structure including:
a first portion extending in the first direction between the first conductive line structures on the substrate, the first portion contacting each of opposite sidewalls in the second direction of the variable resistance patterns; and
second portions extending in the second direction from the first portion on the first conductive line structures, each of the second portions contacting a sidewall in the first direction of a corresponding one of the variable resistance patterns;
molds on each of the first conductive line structures, each of the molds contacting a sidewall in the first direction of the corresponding one of the variable resistance patterns, and the sidewall not being contacted by each of the second portions;
a low resistance pattern contacting an upper surface of each of the variable resistance patterns; and
a selection structure on the low resistance pattern,
wherein each of the first conductive line structures includes an adiabatic line between first conductive lines in the third direction, and
wherein the selection structure includes a first buffer, a selection pattern, and a second buffer sequentially stacked in the third direction.

19. The variable resistance memory device as claimed in claim 18, further comprising an etch stop pattern on each of the molds.

20. The variable resistance memory device as claimed in claim 18, wherein heat is generated in each of the variable resistance patterns when electrical signals are applied to the first and second conductive lines, the phase of the variable resistance pattern changing according to the heat.

* * * * *